(12) United States Patent
Lee et al.

(10) Patent No.: US 12,154,926 B2
(45) Date of Patent: Nov. 26, 2024

(54) IMAGE SENSOR

(71) Applicant: SAMSUNG ELECTRONICS CO., LTD., Suwon-si (KR)

(72) Inventors: Kyung Duck Lee, Hwaseong-si (KR); Doo Sik Seol, Suwon-si (KR); Kyung Ho Lee, Suwon-si (KR); Tae Sub Jung, Hwaseong-si (KR); Masato Fujita, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 518 days.

(21) Appl. No.: 17/360,447

(22) Filed: Jun. 28, 2021

(65) Prior Publication Data

US 2022/0123032 A1    Apr. 21, 2022

(30) Foreign Application Priority Data

Oct. 16, 2020  (KR) ........................ 10-2020-0133997

(51) Int. Cl.
*H01L 27/146*    (2006.01)
*H01L 23/60*    (2006.01)

(52) U.S. Cl.
CPC .......... *H01L 27/1463* (2013.01); *H01L 23/60* (2013.01); *H01L 27/14621* (2013.01); *H01L 27/14627* (2013.01); *H01L 27/14636* (2013.01); *H01L 27/1464* (2013.01); *H01L 27/14645* (2013.01)

(58) Field of Classification Search
CPC ........... H01L 27/1463; H01L 27/14627; H01L 27/1464; H01L 27/14645; H01L 27/14636
See application file for complete search history.

(56) References Cited

U.S. PATENT DOCUMENTS

| | | | |
|---|---|---|---|
| 9,466,629 B2 | 10/2016 | Yoon et al. | |
| 9,876,044 B2 | 1/2018 | Lee et al. | |
| 2018/0047766 A1* | 2/2018 | Pyo | H01L 27/1463 |
| 2019/0043901 A1 | 2/2019 | Honda et al. | |
| 2019/0214421 A1 | 7/2019 | Kim et al. | |
| 2020/0083263 A1 | 3/2020 | Tanaka et al. | |
| 2020/0235149 A1* | 7/2020 | Shiraishi | H01L 27/14607 |

(Continued)

FOREIGN PATENT DOCUMENTS

| | | |
|---|---|---|
| JP | 2018201015 | 12/2018 |
| KR | 1020190110538 | 9/2019 |

*Primary Examiner* — Nicholas J Tobergte
*Assistant Examiner* — Adin Hrnjic
(74) *Attorney, Agent, or Firm* — F. Chau & Associates, LLC

(57) ABSTRACT

An image sensor includes a substrate including a first side on which light is incident, and a second side opposite to the first side, a pixel isolation pattern formed inside the substrate which defines a plurality of unit pixels, a first photoelectric conversion region and a second photoelectric conversion region arranged along a first direction, inside each of the unit pixels, and a region isolation pattern which protrudes from the pixel isolation pattern in a second direction intersecting the first direction, and defines an isolation region between the first photoelectric conversion region and the second photoelectric conversion region. A first width of the isolation region in the second direction on the first side is more than about 1.1 times a second width of the isolation region in the second direction on the second side.

18 Claims, 26 Drawing Sheets

(56) References Cited

U.S. PATENT DOCUMENTS

| | | | |
|---|---|---|---|
| 2021/0013249 A1* | 1/2021 | Yang | H01L 27/1463 |
| 2021/0134863 A1* | 5/2021 | Suzuki | H01L 27/14629 |
| 2021/0167104 A1* | 6/2021 | Rao | H01L 27/14689 |

* cited by examiner

IMAGE SENSOR

CROSS-REFERENCE TO RELATED APPLICATIONS

This application claims priority under 35 U.S.C. § 119 to Korean Patent Application No. 10-2020-0133997, filed on Oct. 16, 2020 in the Korean Intellectual Property Office, the disclosure of which in incorporated by reference herein in its entirety.

TECHNICAL FIELD

Embodiments of the present disclosure relate to an image sensor. More specifically, embodiments of the present disclosure relate to an image sensor that includes a pixel isolation pattern.

DISCUSSION OF RELATED ART

An image sensor is a type of semiconductor element that converts optical information into an electric signal. An image sensor may include, for example, a charge coupled device (CCD) image sensor and a complementary metal-oxide semiconductor (CMOS) image sensor.

An image sensor may be configured in the form of a package, which may be configured as a structure that protects the image sensor and allows light to enter onto a photo receiving surface or a sensing region of the image sensor.

Recently, a backside illumination (BSI) image sensor, in which incident light is radiated through a back side of a semiconductor substrate so that pixels formed in the image sensor have increased light reception efficiency and sensitivity, has been studied.

SUMMARY

Aspects of the present disclosure provide an image sensor with improved performance.

According to an embodiment of the present disclosure, an image sensor includes a substrate including a first side on which light is incident, and a second side opposite to the first side, a pixel isolation pattern formed inside the substrate which defines a plurality of unit pixels, a first photoelectric conversion region and a second photoelectric conversion region arranged along a first direction, inside each of the unit pixels, and a region isolation pattern which protrudes from the pixel isolation pattern in a second direction intersecting the first direction, and defines an isolation region between the first photoelectric conversion region and the second photoelectric conversion region. A first width of the isolation region in the second direction on the first side is more than about 1.1 times a second width of the isolation region in the second direction on the second side.

According to an embodiment of the present disclosure, an image sensor includes a substrate including a first side and a second side opposite to each other, a pixel isolation pattern formed inside the substrate which defines a plurality of unit pixels, and a first photoelectric conversion region and a second photoelectric conversion region arranged along a first direction, inside each of the unit pixels. The image sensor further includes a region isolation pattern which protrudes from the pixel isolation pattern in a second direction intersecting the first direction, and defines an isolation region between the first photoelectric conversion region and the second photoelectric conversion region, and a plurality of microlenses disposed on the first side of the substrate in correspondence with the plurality of the unit pixels. The image sensor further includes an electronic element disposed on the second side of the substrate, and a wiring structure which includes an inter-wiring insulating film which covers the electronic element, and a plurality of wirings formed in the inter-wiring insulating film. A first width of the isolation region in the second direction on the first side is more than about 1.1 times a second width of the isolation region in the second direction on the second side.

According to an embodiment of the present disclosure, an image sensor includes a substrate including a first side on which light is incident, and a second side opposite to the first side, a unit pixel formed in the substrate, and a pixel isolation pattern which surrounds the unit pixel. The image sensor further includes a first photoelectric conversion region and a second photoelectric conversion region arranged along a first direction inside the unit pixel. The image sensor further includes a first region isolation pattern which protrudes from the pixel isolation pattern in a second direction intersecting the first direction and is interposed between the first photoelectric conversion region and the second photoelectric conversion region, and a second region isolation pattern which is spaced apart from the first region isolation pattern in the second direction, protrudes from the pixel isolation pattern in the second direction intersecting the first direction, and is interposed between the first photoelectric conversion region and the second photoelectric conversion region. A first width at which the first region isolation pattern and the second region isolation pattern are separated on the first side is greater than a second width at which the first region isolation pattern and the second region separation are separated on the second side.

BRIEF EXPLANATION OF THE DRAWINGS

The above and other aspects and features of the present disclosure will become more apparent by describing in detail embodiments thereof with reference to the accompanying drawings, in which.

DETAILED DESCRIPTION OF THE EMBODIMENTS

Figure 1:
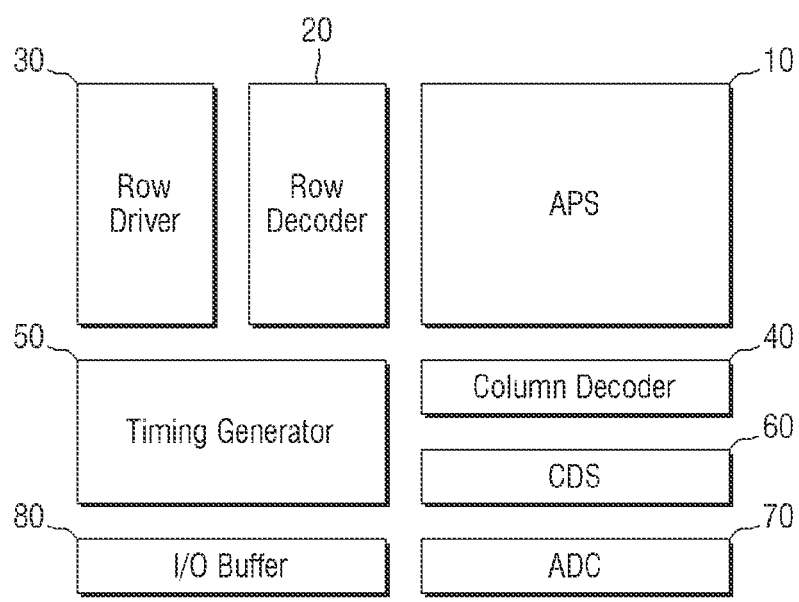
FIG. 1 is an exemplary block diagram for describing an image sensor according to some embodiments.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Hereinafter, various image sensors according to embodiments of the present disclosure will be described with reference to FIGS. 1 to 26.

Figure 2:
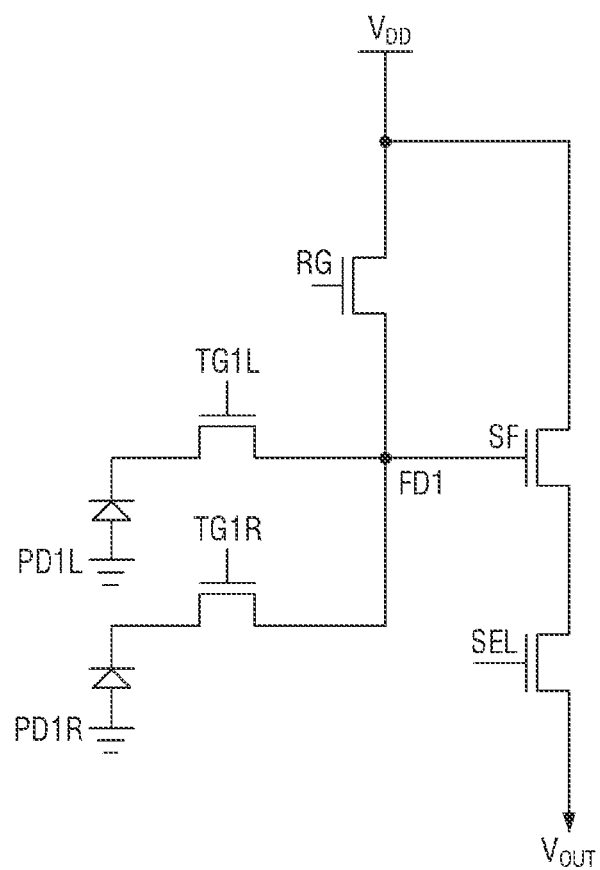
FIG. 2 is an exemplary circuit diagram for describing a unit pixel of an image sensor according to some embodiments.

FIG. 1 is an exemplary block diagram for describing an image sensor according to some embodiments. FIG. 2 is an exemplary circuit diagram for describing a unit pixel of an image sensor according to some embodiments.

Referring to FIG. 1, the image sensor according to some embodiments of the present disclosure includes an active pixel sensor array (APS) 10, a row decoder 20, a row driver 30, a column decoder 40, a timing generator 50, a correlated double sampler (CDS) 60, an analog-to-digital converter (ADC) 70, and an input/output buffer (I/O buffer) 80.

The active pixel sensor array 10 includes a plurality of unit pixels arranged two-dimensionally, and may convert an optical signal into an electric signal. The active pixel sensor array 10 may be driven by a plurality of drive signals, such as, for example, pixel selection signals, reset signals, and charge transfer signals, from the row driver 30. The electrical signal converted by the active pixel sensor array 10 may be provided to the correlated double sampler 60.

The row driver 30 may provide a large number of drive signals for driving a plurality of unit pixels to the active pixel sensor array 10 according to the result decoded by the row decoder 20. When the unit pixels are arranged in the form of a matrix, the drive signals may be provided for each row.

The timing generator 50 may provide a timing signal and a control signal to the row decoder 20 and the column decoder 40.

The correlated double sampler (CDS) 60 may receive, hold and sample the electrical signals generated by the active pixel sensor array 10. The correlated double sampler 60 may doubly sample a specific noise level and the signal level due to an electrical signal, and output a difference level corresponding to a difference between the noise level and the signal level.

The analog-to-digital converter (ADC) 70 may convert the analog signal corresponding to the difference level, which is output from the correlated double sampler 60, into a digital signal and output the digital signal.

The input/output buffer 80 latches the digital signal, and the latched signal may sequentially output the digital signal to an image signal processing unit according to the decoding result from the column decoder 40.

Referring to FIG. 2, each unit pixel may include a first photoelectric conversion unit PD1L, a second photoelectric conversion unit PD1R, a first transfer gate TG1L, a second transfer gate TG1R, a floating diffusion region FD, a reset gate RG, a source follower gate SF and a selection gate SEL.

The first photoelectric conversion unit PD1L and the second photoelectric conversion unit PD1R may each generate electric charges in proportion to an amount of light incident from outside the image sensor. The first photoelectric conversion unit PD1L may be coupled with the first transfer gate TG1L. The second photoelectric conversion unit PD1R may be coupled with the second transfer gate TG1R.

Since the floating diffusion region FD1 is a region that converts the electric charge into voltage and has a parasitic capacitance, the electric charges may be cumulatively stored therein. The first transfer gate TG1L is driven by a first transfer line that applies a predetermined bias, and may transfer the electric charges generated from the first photoelectric conversion unit PD1L to the floating diffusion region FD1. The second transfer gate TG1R is driven by a second transfer line that applies a predetermined bias, and may transfer the electric charges generated from the second photoelectric conversion unit PD1R to the floating diffusion region FD1.

In some embodiments, the first transfer gate TG1L and the second transfer gate TG1R may share the floating diffusion region FD1. For example, one end of the first transfer gate TG1L may be connected to the first photoelectric conversion unit PD1L, and the other end of the first transfer gate TG1L may be connected to the floating diffusion region FD1. One end of the second transfer gate TG1R may be connected to the second photoelectric conversion unit PD1R, and the other end of the second transfer gate TG1R may be connected to the floating diffusion region FD1.

The source follower gate SF amplifies a change in the electrical potential of the floating diffusion region FD1 to which electric charges are transmitted from the first photoelectric conversion unit PD1L and the second photoelectric conversion unit PD1R, and may output it as an output voltage $V_{OUT}$. When the source follower gate SF is turned on, a predetermined electrical potential provided to a drain of the source follower gate SF, for example, a power supply voltage $V_{DD}$, may be transmitted to a drain region of the selection gate SEL.

The selection gate SEL may select the unit pixel to be read row by row. The selection gate SEL may be driven by a selection line that applies a predetermined bias.

The reset gate RG may periodically reset the floating diffusion region FD1. The reset gate RG may be driven by a reset line that applies a predetermined bias. When the reset gate RG is turned on, a predetermined electrical potential to be provided to the drain of the reset gate RG, for example, the power supply voltage $V_{DD}$, may be transmitted to the floating diffusion region FD1.

Figure 3:
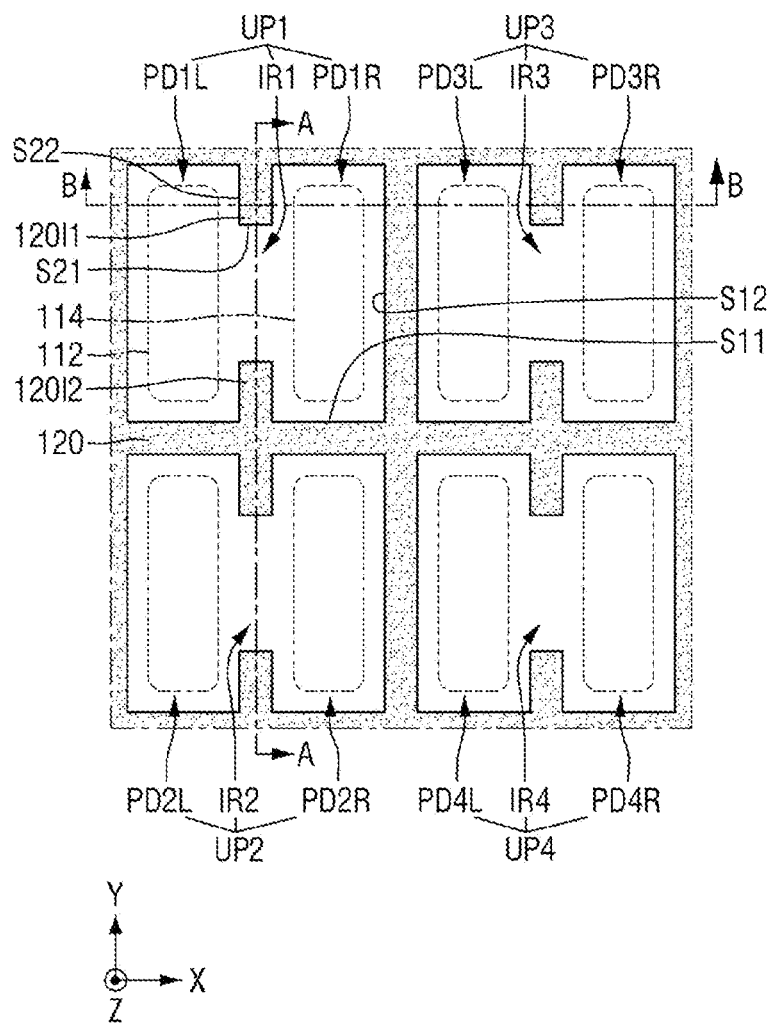
FIG. 3 is a layout diagram for describing unit pixels of an image sensor according to some embodiments.
Figure 4:
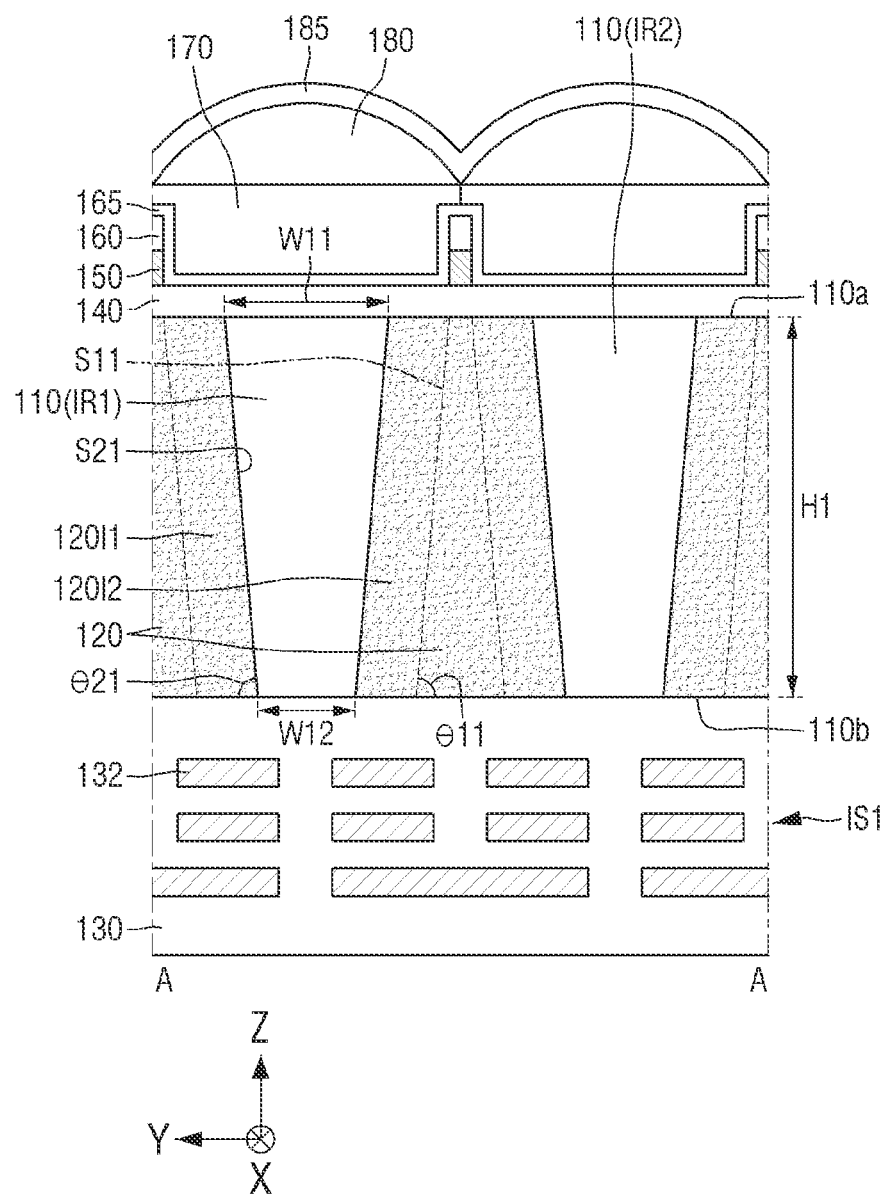
FIG. 4 is a cross-sectional view taken along a line A-A of FIG. 3.
Figure 5:
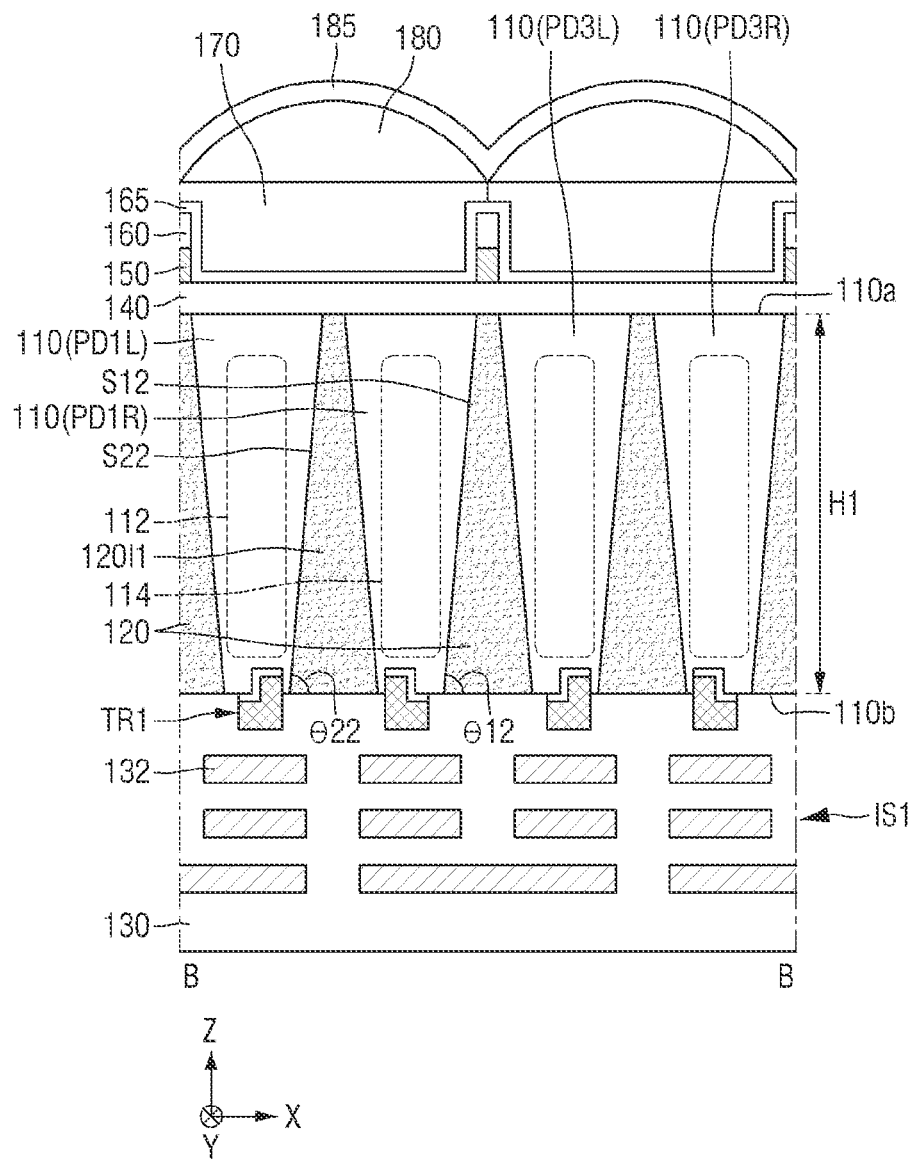
FIG. 5 is a cross-sectional view taken along a line B-B of FIG. 3.

FIG. 3 is a layout diagram for describing unit pixels of an image sensor according to some embodiments. FIG. 4 is a cross-sectional view taken along line A-A of FIG. 3. FIG. 5 is a cross-sectional view taken along line B-B of FIG. 3.

Referring to FIGS. 3 to 5, the image sensor according to some embodiments may include a first substrate 110, a plurality of unit pixels UP1 to UP4, a pixel isolation pattern 120, first and second region isolation patterns 120I1 and 120I2, a first wiring structure IS1, a surface insulating film 140, a color filter 170 and a microlens 180.

The first substrate 110 may be a semiconductor substrate. For example, the first substrate 110 may be bulk silicon or SOI (silicon-on-insulator). In an embodiment, the first substrate 110 may be a silicon substrate or may include other materials such as, for example, silicon germanium, indium antimonide, lead tellurium compounds, indium arsenic, indium phosphide, gallium arsenide or gallium antimonide. In an embodiment, the first substrate 110 may be an epitaxial layer formed on the base substrate.

The first substrate 110 may include a first side surface 110a and a second side surface 110b that are opposite to each other. In embodiments to be described below, the first side surface 110a may be referred to as a first side or a back side of the first substrate 110, and the second side surface 110b may be referred to as a second side or a front side of the first substrate 110. In some embodiments, the first side surface 110a of the first substrate 110 may be a photo receiving surface on which light is incident. That is, the image sensor according to some embodiments may be a backside illumination (BSI) image sensor.

In some embodiments, the first substrate 110 may include impurities of a first conductive type. In the following embodiments, although the first conductive type will be described as a p-type, this is only an example, and embodiments of the present disclosure are not limited thereto. For example, in some embodiments, the first conductive type may be an n-type.

In some embodiments, the thickness of the first substrate 110 may be about 5000 nm to about 6000 nm. Here, the thickness of the first substrate 110 means a thickness in a vertical direction Z. For example, a distance H1 by which the first side surface 110a and the second side surface 110b are spaced may be about 5,000 nm to about 6,000 nm.

A plurality of unit pixels UP1 to UP4 may be formed on the first substrate 110. The plurality of unit pixels UP1 to UP4 may be arranged two-dimensionally (for example, in the form of a matrix) on a plane including a first direction X and a second direction Y. For example, a first unit pixel UP1 and a second unit pixel UP2 may be arranged in the second direction Y. The first unit pixel UP1 and a third unit pixel UP3 may be arranged in the first direction X. A fourth unit pixel UP4 may be arranged with the second unit pixel UP2 in the first direction X, and may be arranged with the third unit pixel UP3 in the second direction Y. That is, the first unit pixel UP1 and the fourth unit pixel UP4 may be arranged diagonally.

Each of the unit pixels UP1 to UP4 may include a first electronic element TR1. In some embodiments, the first electronic element TR1 may be formed on the second side surface 110b of the first substrate 110. The first electronic element TR1 is connected to first photoelectric conversion units PD1L to PD4L and/or second photoelectric conversion units PD1R to PD4R, which will be described later, and may constitute various transistors for processing the electric signals. For example, the first electronic element TR1 may be at least one transistor including the first transfer gate TG1L, the second transfer gate TG1R, the reset gate RG, the source follower gate SF, the selection gate SEL or the like described above with reference to FIG. 2.

In some embodiments, the first electronic element TR1 may include a vertical transfer transistor. For example, at least a part of the first electronic element TR1 including the first transfer gate TG1L described above may be buried in the first substrate 110. The first electronic element TR1 having such a form may reduce an area of a unit pixel, which may allow for high integration of an image sensor.

The pixel isolation pattern 120 may be formed inside the first substrate 110. The pixel isolation pattern 120 may define a plurality of unit pixels UP1 to UP4 inside the first substrate 110. For example, as shown in FIG. 3, the pixel isolation pattern 120 may surround each of the unit pixels UP1 to UP4.

In some embodiments, the pixel isolation pattern 120 may include a first side surface S11 extending in the first direction X, and a second side surface S12 extending in the second direction Y. For example, the first side surface S11 of the pixel isolation pattern 120 may extend along one side surface of each of the unit pixels UP1 to UP4. The second side surface S12 of the pixel isolation pattern 120 may extend along the other side surface of each of the unit pixels UP1 to UP4 that intersect the one side surface of each of the unit pixels UP1 to UP4.

In some embodiments, the pixel isolation pattern 120 may extend from the second side surface 110b of the first substrate 110 to the first side surface 110a of the first substrate 110. For example, the pixel isolation pattern 120 may be formed by burying an insulating material in a deep trench formed in the first substrate 110.

In some embodiments, a width of the pixel isolation pattern 120 decreases from the second side surface 110b of the first substrate 110 to the first side surface 110a of the first substrate 110. For example, the first side surface S11 of the pixel isolation pattern 120 may form a first internal angle θ11, which is an acute angle, with the second side surface 110b of the first substrate 110. Further, the second side surface S12 of the pixel isolation pattern 120 may form a second internal angle θ12, which is an acute angle, with the second side surface 110b of the first substrate 110. Although the first internal angle θ11 and the second internal angle θ12 are shown as being the same, this is only an example, and embodiments of the present disclosure are not limited thereto. For example, in some embodiments, the first internal angle θ11 and the second internal angle θ12 may be different from each other. Further, in this specification, the term "same" means to include not only exactly the same thing, but also minute differences that may occur due to process margins and the like.

The pixel isolation pattern 120 may include, for example, but is not limited to, at least one of silicon oxide, silicon nitride, silicon oxynitride, aluminum oxide, hafnium oxide, and a combination thereof.

The first photoelectric conversion units PD1L to PD4L and the second photoelectric conversion units PD1R to PD4R may be formed inside each of the unit pixels UP1 to UP4. For example, the first photoelectric conversion units PD1L to PD4L and the second photoelectric conversion units PD1R to PD4R may be arranged in the first direction X inside each of the unit pixels UP1 to UP4. The first photoelectric conversion units PD1L to PD4L and the second photoelectric conversion units PD1R to PD4R may each generate electric charges in proportion to the amount of light that is incident from outside the image sensor.

The first photoelectric conversion units PD1L to PD4L may include a first photoelectric conversion region 112 including impurities of a second conductive type inside the first substrate 110. The second photoelectric conversion units PD1R to PD4R may include a second photoelectric conversion region 114 including impurities of the second conductive type inside the first substrate 110. The second conductive type may be different from the first conductive type. In the following embodiments, although the second conductive type will be described as being an n-type, this is only an example, and embodiments of the present disclosure are not limited thereto. For example, in some embodiments, the second conductive type may be a p-type.

The first photoelectric conversion region 112 and the second photoelectric conversion region 114 may be, for example, formed by ion implantation of n-type impurities (for example, phosphorus (P) or arsenic (As)) into the p-type first substrate 110.

In some embodiments, the first photoelectric conversion region 112 and/or the second photoelectric conversion region 114 may be closer to the second side surface 110b of the first substrate 110 than the first side surface 110a of the first substrate 110.

In some embodiments, the first photoelectric conversion region 112 and/or the second photoelectric conversion region 114 may also have a potential slope in a vertical direction Z that intersects the first side 100a and the second side 100b of the first substrate 110. For example, the impurity concentration of the first photoelectric conversion region 112 and/or the second photoelectric conversion region 114 may decrease from the second side 100b toward the first side 100a.

In some embodiments, at least some of the unit pixels UP1 to UP4 may perform an auto focus (AF) function. For example, since each of the unit pixels UP1 to UP4 may include two photoelectric conversion units (e.g., the first photoelectric conversion units PD1L to PD4L and the second photoelectric conversion units PD1R to PD4R), in some embodiments, the auto focus function may be performed using a phase detection AF (PDAF) function.

The first and second region isolation patterns 120I1 and 120I2 may be formed inside the first substrate 110. The first and second region isolation patterns 120I1 and 120I2 may be placed inside each of the unit pixels UP1 to UP4. Each of the first and second region isolation patterns 120I1 and 120I2 protrudes from the pixel isolation pattern 120 and may be interposed between the first photoelectric conversion units PD1L to PD4L and the second photoelectric conversion units PD1R to PD4R. For example, the first region isolation pattern 120I1 protrudes in the second direction Y from one side surface of the pixel isolation pattern 120 extending in the first direction X, and may be interposed between the first photoelectric conversion units PD1L to PD4L and the second photoelectric conversion units PD1R to PD4R. The second region isolation pattern 120I2 protrudes in the second direction Y from the other side surface (for example, the first side surface S11) of the pixel isolation pattern 120 facing the one side surface of the pixel isolation pattern 120, and may be interposed between the first photoelectric conversion units PD1L to PD4L and the second photoelectric conversion units PD1R to PD4R.

The first and second region isolation patterns 120I1 and 120I2 may face each other. For example, the first and second region isolation patterns 120I1 and 120I2 may be arranged in the second direction Y. The first and second region isolation patterns 120I1 and 120I2 may be spaced apart from each other in the second direction Y. The first and second region isolation patterns 120I1 and 120I2 may define the isolation regions IR1 to IR4 between the first photoelectric conversion units PD1L to PD4L and the second photoelectric conversion units PD1R to PD4R. The isolation regions IR1 to IR4 may be defined inside each of the unit pixels UP1 to UP4 between the first region isolation pattern 120I1 and the second region isolation pattern 120I2. The first region isolation pattern 120I1, the isolation regions IR1 to IR4 and the second region isolation pattern 120I2 may be arranged sequentially along the second direction Y. Accordingly, the first photoelectric conversion units PD1L to PD4L and the second photoelectric conversion units PD1R to PD4R may be separated from each other by the first region isolation pattern 120I1, the isolation regions IR1 to IR4, and the second region isolation pattern 120I2.

In some embodiments, the first and second region isolation patterns 120I1 and 120I2 may include a third side surface S21 intersecting the second direction Y, and a fourth side surface S22 intersecting the first direction X, respectively. For example, the third side surface S21 of the first and second region isolation patterns 120I1 and 120I2 may extend in the first direction X. The fourth side surface S22 of the first and second region isolation patterns 120I1 and 120I2 may extend in the second direction Y.

In some embodiments, the first and second region isolation patterns 120I1 and 120I2 may extend from the second side surface 110b of the first substrate 110 to the first side surface 110a of the first substrate 110, respectively. For example, the first and second region isolation patterns 120I1 and 120I2 may be formed by burying an insulating material in a deep trench formed inside the first substrate 110.

In some embodiments, the widths of each of the first and second region isolation patterns 120I1 and 120I2 may decrease from the second side surface 110b of the first substrate 110 toward the first side surface 110a of the first substrate 110. For example, the third side surface S21 of the first and second region isolation patterns 120I1 and 120I2 may form a third internal angle θ21 which is an acute angle with the second side surface 110b of the first substrate 110. Further, the fourth side surface S22 of the first and second region isolation patterns 120I1 and 120I2 may form a fourth internal angle θ22 which is an acute angle with the second side surface 110b of the first substrate 110. Although the third internal angle θ21 and the fourth internal angle θ22 are shown as being the same, this is only an example, and embodiments of the present disclosure are not limited thereto. For example, according to embodiments, the third internal angle θ21 and the fourth internal angle θ22 may be different from each other. Also, although the first internal angle θ11 and the third internal angle θ21 are shown as being the same, and the second internal angle θ12 and the fourth internal angle θ22 are shown as being the same, this is also only an example, and embodiments of the present disclosure are not limited thereto. For example, according to embodiments, the first internal angle θ11 and the third internal angle θ21 may be different from each other, and the second internal angle θ12 and the fourth internal angle θ22 may be different from each other.

The first and second region isolation patterns 120I1 and 120I2 may each include, for example, but are not limited to, at least one of silicon oxide, silicon nitride, silicon oxynitride, aluminum oxide, hafnium oxide, and combinations thereof. In some embodiments, the first and second region isolation patterns 120I1 and 120I2 may be formed at the same level as the pixel isolation pattern 120. As used herein, the expression "formed at the same level" means formation by the same fabricating process. For example, the first and second region isolation patterns 120I1 and 120I2 may include the same material as the pixel isolation pattern 120.

A first width W11 in the second direction Y of the isolation regions IR1 to IR4 on the first side surface 110a of the first substrate 110 made be greater than a second width W12 in the second direction Y of the isolation regions IR1 to IR4 on the second side surface 110b of the first substrate 110. For example, as shown in FIG. 4, the first width W11 at which the first region isolation pattern 120I1 and the second region isolation pattern 120I2 are separated on the first side surface 110a of the first substrate 110 may be greater than the second width W12 at which the first region isolation pattern 120I1 and the second region isolation pattern 120I2 are separated on the second side surface 110b of the first substrate 110.

In some embodiments, the first width W11 may be more than about 1.1 times the second width W12. As an example, the first width W11 may be more than about 1.1 times and less than about 10 times the second width W12. As an example, the first width W11 may be about 280 nm to about 320 nm, and the second width W12 may be about 230 nm to about 270 nm. In an embodiment, the first width W11 may be about 285 nm to about 315 nm, and the second width W12 may be about 235 nm to about 265 nm.

In some embodiments, the width of the isolation regions IR1 to IR4 in the second direction Y may gradually increase from the second side surface 110b of the first substrate 110 toward the first side surface 110a of the first substrate 110. For example, as shown in FIG. 4, the width of each of the first and second region isolation patterns 120I1 and 120I2 in the second direction Y may gradually decrease from the second side surface 110b of the first substrate 110 toward the first side surface 110a of the first substrate 110.

The first wiring structure IS1 may be formed on the first substrate 110. In some embodiments, the first wiring structure IS1 may cover the second side surface 110b of the first substrate 110. The first wiring structure IS1 may be made up of one wiring or a plurality of wirings. For example, the first wiring structure IS1 may include the first inter-wiring insulating film 130, and a plurality of first wirings 132 in the first inter-wiring insulating film 130. In FIGS. 4 and 5, the number of layers of wiring constituting the first wiring structure IS1 and the arrangement thereof are only examples, and embodiments of the present disclosure are not limited thereto.

In some embodiments, the first wiring 132 may be electrically connected to the unit pixels UP1 to UP4. For example, the first wiring 132 may be connected to the first electronic element TR1.

The surface insulating film 140 may be formed on the first substrate 110. In some embodiments, the surface insulating film 140 may extend along the first side surface 110a of the first substrate 110. The surface insulating film 140 may include an insulating material. For example, the surface insulating film 140 may include, but is not limited to, at least one of silicon oxide, silicon nitride, silicon oxynitride, aluminum oxide, hafnium oxide, and a combination thereof.

In some embodiments, the surface insulating film 140 may be formed of multiple films. For example, unlike the example illustrated and described herein, in an embodiment, the surface insulating film 140 may include an aluminum oxide film, a hafnium oxide film, a silicon oxide film, a silicon nitride film and a hafnium oxide film that are sequentially stacked on the first side surface 110a of the first substrate 110.

The surface insulating film 140 may function as an antireflection film to prevent or reduce reflection of light incident on the first substrate 110, thereby increasing the photo receiving rate of the first photoelectric conversion units PD1L to PD4L and the second photoelectric conversion units PD1R to PD4R. Further, the surface insulating film 140 may function as a flattening film to form a color filter 170 and a microlens 180, which will be described later, at a uniform height.

The color filter 170 may be formed on the surface insulating film 140. The color filters 170 may be arranged to correspond to the unit pixels UP1 to UP4. For example, a plurality of color filters 170 may be arranged two-dimensionally (for example, in the form of a matrix) in a plane including the first direction X and the second direction Y.

The color filter 170 may have various colors depending on the unit pixels UP1 to UP4. For example, the color filter 170 may be arranged in a Bayer pattern that includes a red color filter, a green color filter, and a blue color filter. However, this is only an example, and embodiments of the present disclosure are not limited thereto. For example, in some embodiments, the color filter 170 may include a yellow filter, a magenta filter and a cyan filter, and may further include a white filter.

In some embodiments, grid patterns 150 and 160 may be formed between the color filters 170. The grid patterns 150 and 160 may be formed on the surface insulating film 140. The grid patterns 150 and 160 are formed in a grid pattern from a planar viewpoint and may be interposed between the color filters 170. In some embodiments, the grid patterns 150 and 160 may overlap the pixel isolation pattern 120 in the vertical direction Z.

In some embodiments, the grid patterns 150 and 160 may include a conductive pattern 150 and a low refractive index pattern 160. The conductive pattern 150 and the low refractive index pattern 160 may be sequentially stacked on, for example, the surface insulating film 140.

The conductive pattern 150 may include a conductive material. For example, the conductive pattern 150 may include, but is not limited to, at least one of titanium (Ti), titanium nitride (TiN), tantalum (Ta), tantalum nitride (TaN), tungsten (W), aluminum (Al), copper (Cu), and combinations thereof. The conductive pattern 150 may prevent the electric charges generated by electrostatic discharge (ESD) or the like from being accumulated on the surface of the first substrate 110 (for example, the first side surface 110a) to prevent or reduce ESD bruise defects.

The low refractive index pattern 160 may include a low refractive index material having a lower refractive index than silicon (Si). For example, the low refractive index pattern 160 may include, but is not limited to, at least one of silicon oxide, aluminum oxide, tantalum oxide, and combinations thereof. The low refractive index pattern 160 may increase the light collection efficiency by refracting or reflecting the obliquely incident light, and may increase the quality of the image sensor.

In some embodiments, a first protective film 165 may be formed on the surface insulating film 140 and the grid patterns 150 and 160. For example, the first protective film 165 may conformally extend along the profile of the upper surface of the surface insulating film 140, and the side surfaces and the upper surfaces of the grid patterns 150 and 160.

The first protective film 165 may include, for example, but is not limited to, aluminum oxide. The first protective film 165 may prevent or reduce damage to the surface insulating film 140 and the grid patterns 150 and 160.

The microlens 180 may be formed on the color filter 170. The microlenses 180 may be arranged to correspond to the unit pixels UP1 to UP4. For example, a plurality of microlenses 180 may be arranged two-dimensionally (for example, in the form of a matrix) in a plane including the first direction X and the second direction Y.

The microlens 180 has a convex shape and may have a predetermined radius of curvature. Accordingly, the microlens 180 may concentrate the light incident on the first photoelectric conversion units PD1L to PD4L and the first photoelectric conversion units PD1L to PD4L. The microlens 180 may include, for example, but is not limited to, a light transmitting resin.

In some embodiments, a second protective film 185 may be formed on the microlens 180. The second protective film 185 may extend along the surface of the microlens 180. The second protective film 185 may include, for example, an inorganic oxide film. For example, the second protective film 185 may include, but is not limited to, at least one of silicon oxide, titanium oxide, zirconium oxide, hafnium oxide, and a combination thereof. In some embodiments, the second protective film 185 may include a low temperature oxide (LTO).

The second protective film 185 may protect the microlens 180 from external factors. For example, the second protective film 185 may protect the microlens 180 containing an organic material by containing an inorganic oxide film. Also, the second protective film 185 may increase the quality of the image sensor by increasing the light collection efficiency of the microlens 180. For example, the second protective film 185 may fill the space between the microlens 180, thereby reducing the reflection, refraction, scattering, and the like of incident light that reaches the space between the microlenses 180.

To improve the autofocus (AF) function of the image sensor, an image sensor including two photoelectric conversion units per unit pixel may be utilized. For example, a region isolation pattern (for example, first and second region isolation patterns 120I1 and 120I2) that separates two photoelectric conversion units may be formed in a unit pixel. However, as image sensors become increasingly integrated, the photo receiving area may decrease due to the region isolation pattern, and as a result, the sensitivity of a unit pixel may decrease, and crosstalk may occur. If the size of the region isolation pattern is reduced to in an effort to account for this, difficulty in separation between the photoelectric conversion units in the unit pixel may arise.

However, the image sensor according to some embodiments may adjust the width of the first and second region isolation patterns 120I1 and 120I2 to increase the performance of the image sensor. For example, as described above, the isolation regions IR1 to IR4 defined by the first and second region isolation patterns 120I1 and 120I2 may have a first width W11 that is greater than the second width W12. Accordingly, the image sensor according to some embodiments may increase the sensitivity by securing a wide photo receiving area on the first side surface 110a, and may reduce crosstalk due to the first and second region isolation patterns 120I1 and 120I2.

Further, the isolation regions IR1 to IR4 of the image sensor according to some embodiments may have a width W12 smaller than the first width W11 on the second side surface 110b opposite to the first side surface 110a. That is, a gap between the first and second region isolation patterns 120I1 and 120I2 may be provided to be narrow on the second side surface 110b of the first substrate 110. Accordingly, the image sensor according to some embodiments may facilitate separation between the first photoelectric conversion units PD1L to PD4L and the second photoelectric conversion units PD1R to PD4R in each of the unit pixels UP1 to UP4.

As described above, the first width W11 may be more than about 1.1 times the second width W12. When the first width W11 is more than about 1.1 times the second width W12, a sufficient photo receiving area may be secured on the first side surface 110a, and separation between the first photoelectric conversion units PD1L to PD4L and the second photoelectric conversion units PD1R to PD4R may be further facilitated on the second side surface 110b.

Figure 6:
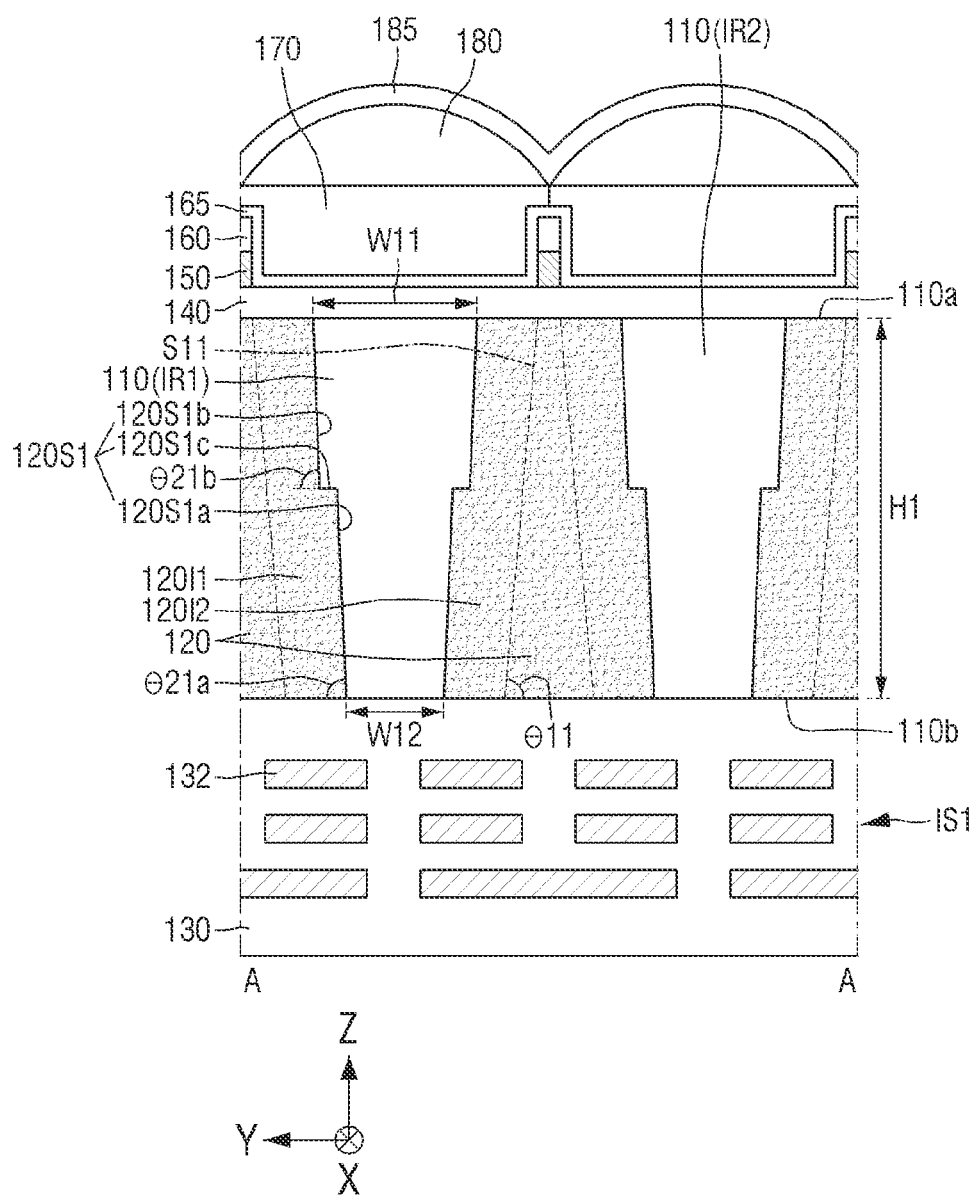
FIG. 6 is a cross-sectional view for describing an image sensor according to some embodiments.

FIG. 6 is a cross-sectional view for describing an image sensor according to some embodiments. FIG. 6 is a cross-sectional view taken along line A-A of FIG. 3. For convenience of explanation, a further description of components and technical aspects previously described will be only briefly described or omitted.

Referring to FIGS. 3, 5 and 6, in the image sensor according to some embodiments, the side surface of the first region isolation pattern 120I1 and/or the side surfaces of the second region isolation patterns 120I1 and 120I2 may include steps.

For example, the third side surface S21 of the first region isolation pattern 120I1 may include a first inclined surface 120S1a, a horizontal portion 120S1c and a second inclined surface 120S1b. The first inclined surface 120S1a may extend from the second side surface 110b of the first substrate 110. The second inclined surface 120S1b may extend from the first side surface 110a of the first substrate 110. The horizontal portion 120S1c extends in a direction parallel to the surface of the first substrate 110 (e.g., the first side surface 110a or the second side surface 110b), and may connect the first inclined surface 120S1a and the second inclined surface 120S1b.

In some embodiments, the first inclined surface 120S1a may form a fifth internal angle θ21a which is an acute angle with the second side surface 110b of the first substrate 110. Further, the second inclined surface 120S1b may form a sixth internal angle θ21b which is an acute angle with the horizontal portion 120S1c. Although the fifth internal angle θ21a and the sixth internal angle θ21b are shown as being the same, this is only an example, and embodiments of the present disclosure are not limited thereto. For example, in some embodiments, the fifth internal angle θ21a and the sixth internal angle θ21b may be different from each other to adjust the first width W11 and the second width W12 of the isolation regions IR1 to IR4.

In FIG. 6, although the fifth internal angle θ21a and sixth internal angle θ21b are shown as being greater than the first internal angle θ11, this is only an example, and embodiments of the present disclosure are not limited thereto. For example, in some embodiments, the fifth internal angle θ21a and the sixth internal angle θ21b may be the same as or smaller than the first internal angle θ11, respectively.

Further, although FIG. 6 shows that only the third side surface S21 of the first and second region isolation patterns 120I1 and 120I2 has a step, embodiments of the present disclosure are not limited thereto. For example, in some embodiments, the fourth side surface S22 of the first and second region isolation patterns 120I1 and 120I2 may also have a step similar to the first side surface S11. Or, for example, the side surfaces (for example, the first side surface S11 or the second side surface S12) of the pixel isolation pattern 120 may have a step similar to the first side surface S11.

Figure 7:
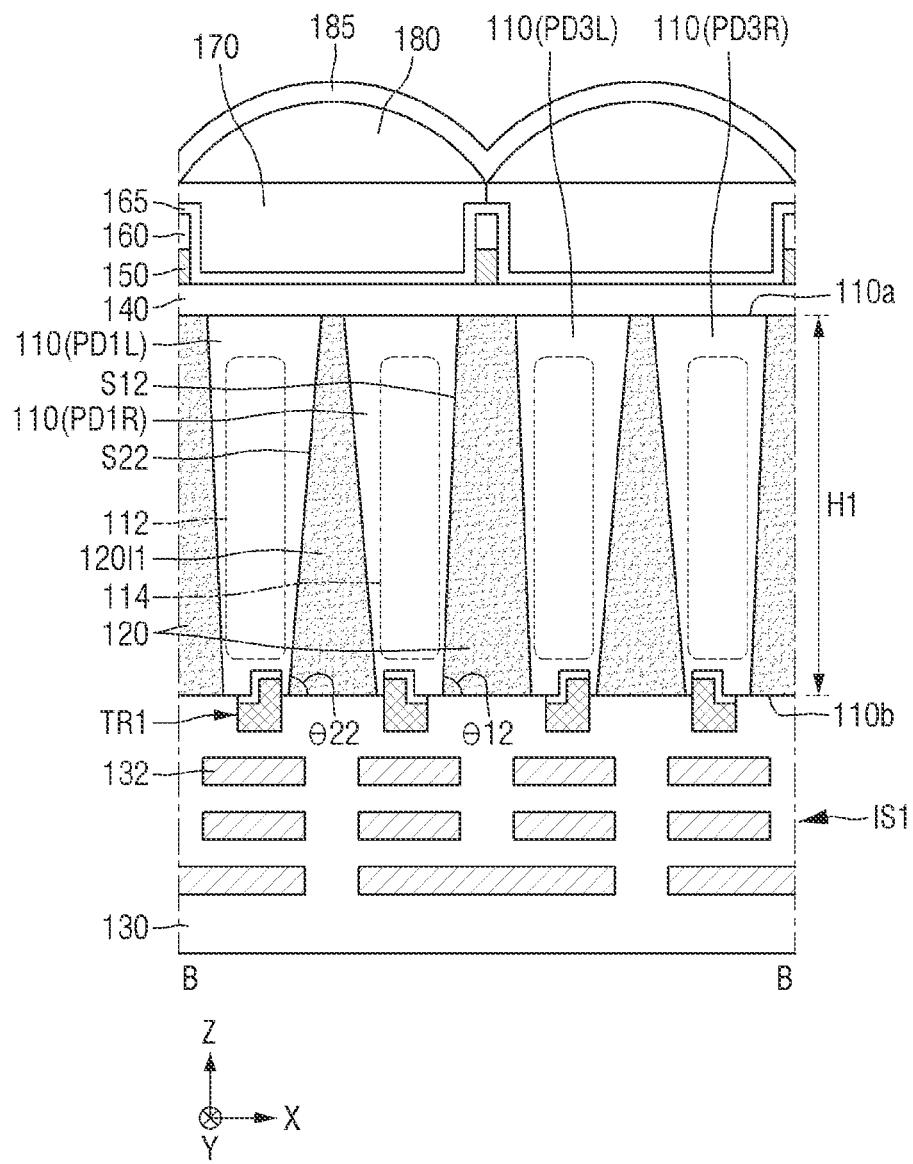
FIGS. 7 and 8 are various cross-sectional views for describing an image sensor according to some embodiments.
Figure 8:
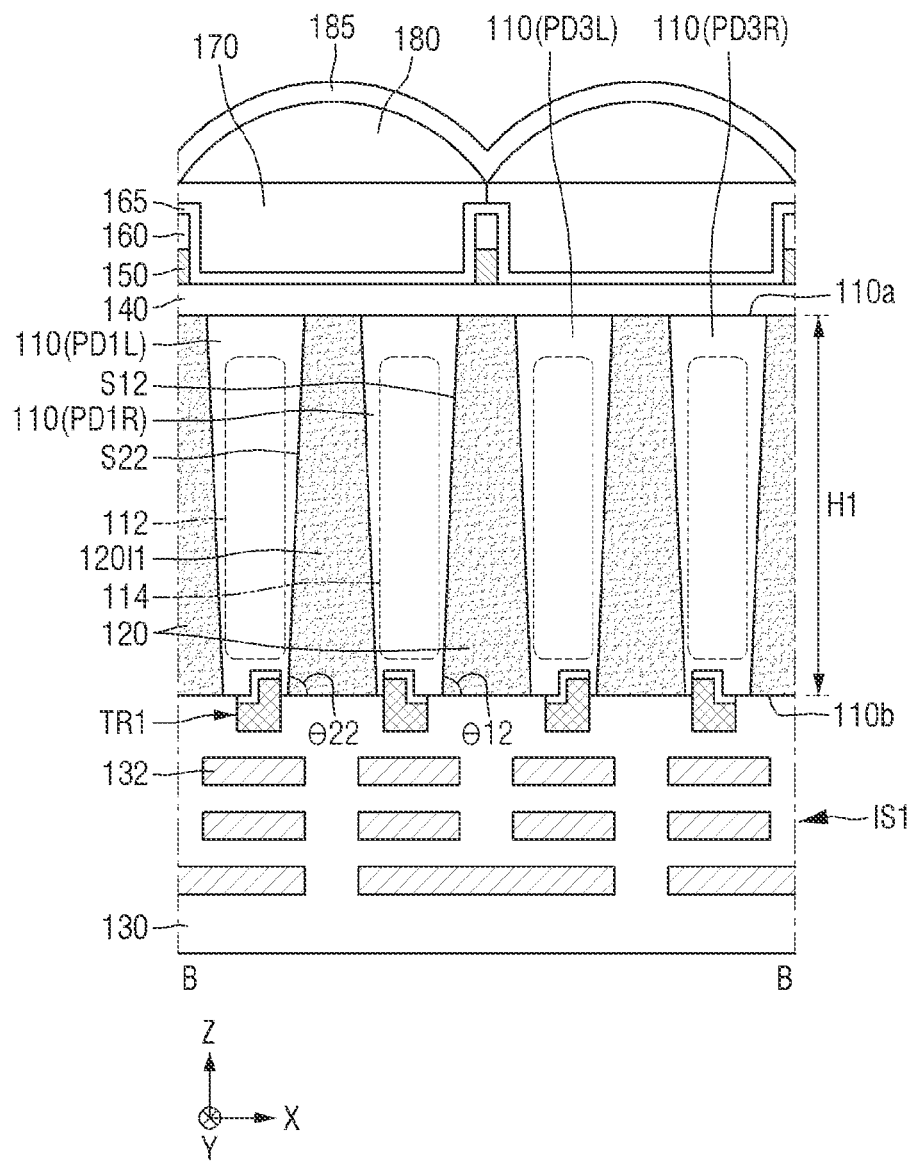

FIGS. 7 and 8 are various cross-sectional views for describing an image sensor according to some embodiments. FIGS. 7 and 8 are cross-sectional views taken along line B-B of FIG. 8. For convenience of explanation, a further description of components and technical aspects previously described will be only briefly described or omitted.

Referring to FIGS. 3, 4 and 7, in an image sensor according to some embodiments, the slope of the third side surface S21 of the first and second region isolation patterns 120I1 and 120I2 may be less than the slope of the side surface of the pixel isolation pattern 120.

For example, the third internal angle θ21 of the first and second region isolation patterns 120I1 and 120I2 may be an acute angle smaller than the second internal angle θ12 (or the first internal angle θ11) of the pixel isolation pattern 120.

In some embodiments, the slope of the fourth side surface S22 of the first and second region isolation patterns 120I1 and 120I2 may be less than the slope of the side surface of the pixel isolation pattern 120. For example, the fourth internal angle θ22 of the first and second region isolation patterns 120I1 and 120I2 may be an acute angle smaller than the second internal angle θ12 (or the first internal angle θ11) of the pixel isolation pattern 120.

Referring to FIGS. 3, 4 and 8, in an image sensor according to some embodiments, the slope of the third side surface S21 of the first and second region isolation patterns 120I1 and 120I2 may be less than the slope of the fourth side surface S22 of the first and second region isolation patterns 120I1 and 120I2.

For example, the third internal angle θ21 of the first and second region isolation patterns 120I1 and 120I2 may be an acute angle smaller than the fourth internal angle θ22 of the first and second region isolation patterns 120I1 and 120I2. Although the second internal angle θ12 and the fourth internal angle θ22 are shown as being the same, this is only an example, and embodiments of the present disclosure are not limited thereto. For example, in some embodiments, the second internal angle θ12 and the fourth internal angle θ22 may be different from each other.

Figure 9:
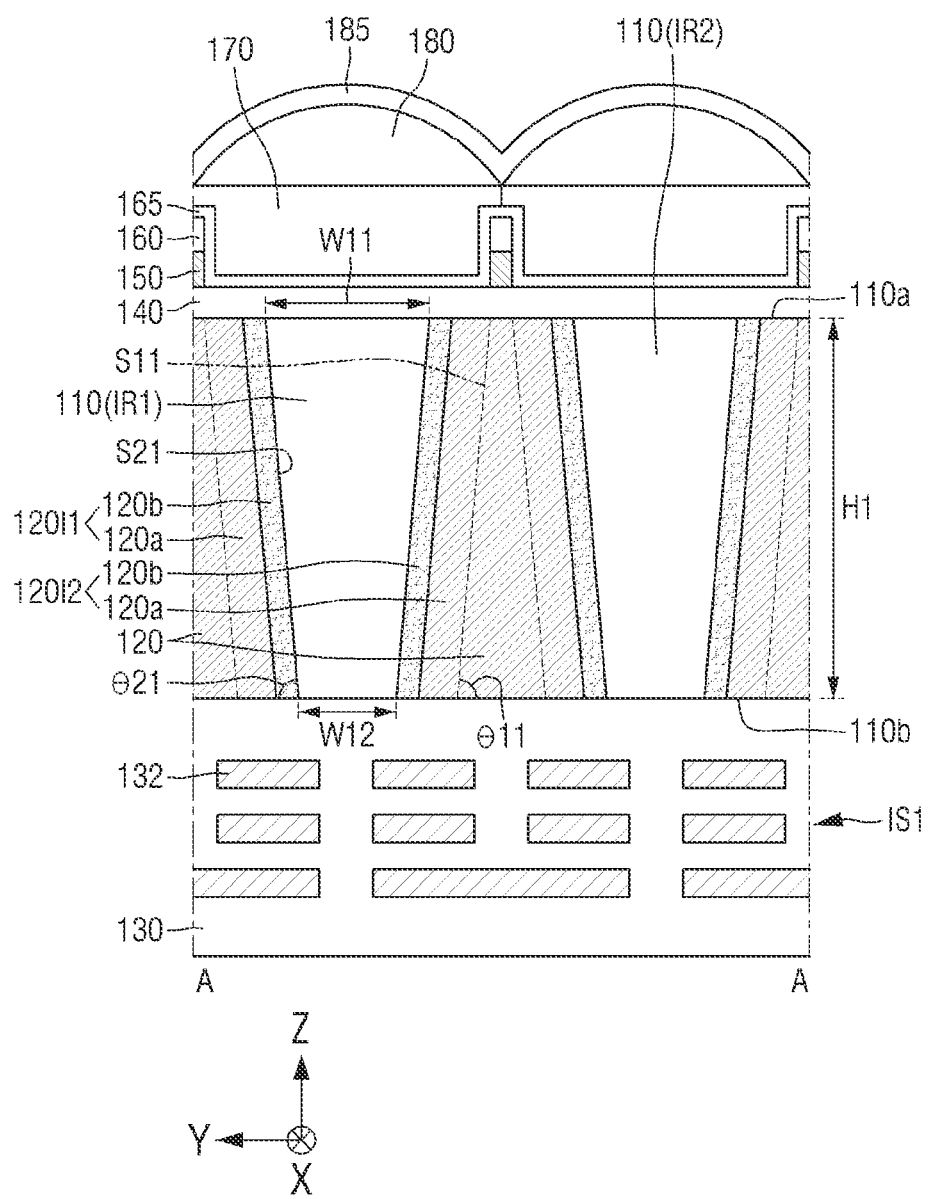
FIGS. 9 and 10 are cross-sectional views for describing an image sensor according to some embodiments.
Figure 10:
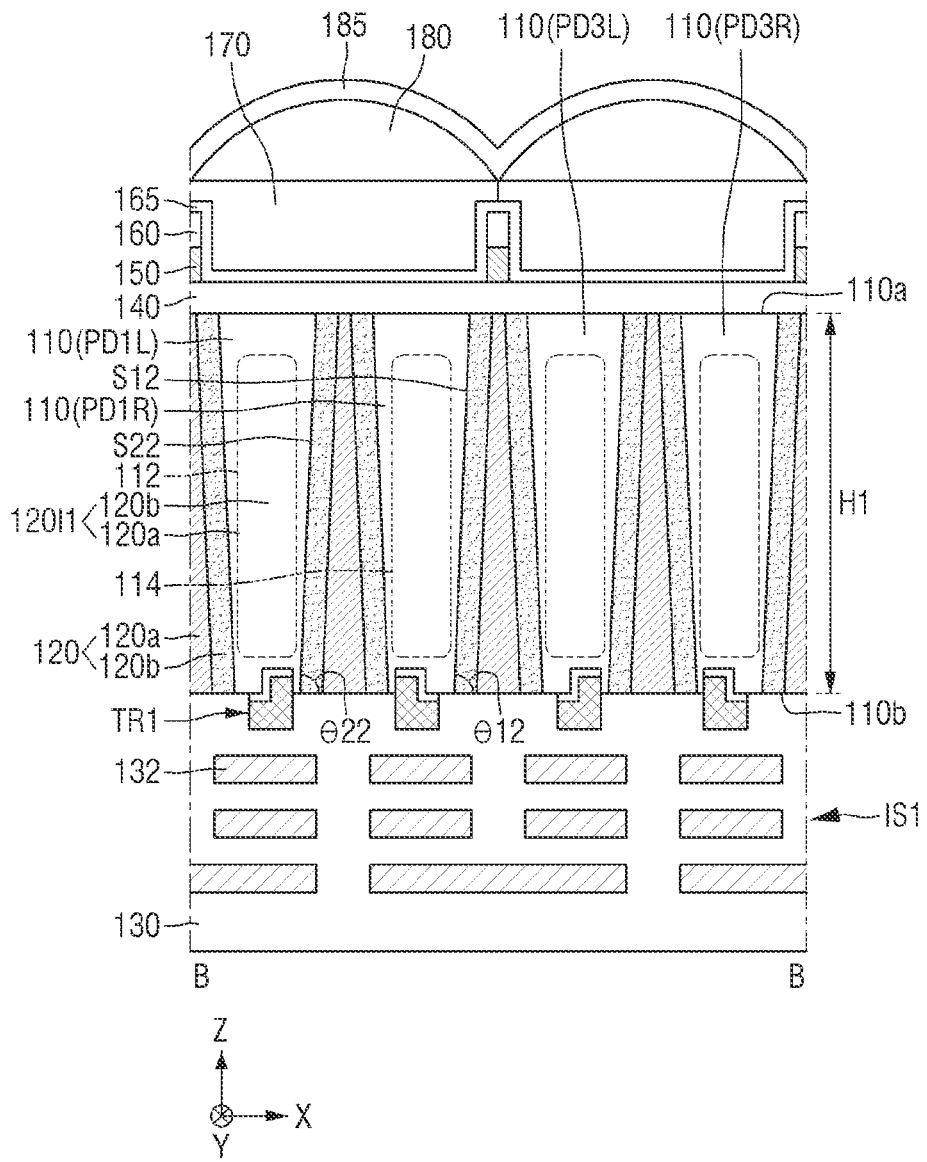

FIGS. 9 and 10 are cross-sectional views for describing an image sensor according to some embodiments. FIG. 9 is a cross-sectional view taken along line A-A of FIG. 3, and FIG. 10 is a cross-sectional view taken along line B-B of FIG. 3. For convenience of explanation, a further description of components and technical aspects previously described will be only briefly described or omitted.

Referring to FIGS. 3, 9 and 10, in an image sensors according to some embodiments, the pixel isolation pattern 120, the first region isolation pattern 120I1 and the second region isolation pattern 120I2 may include a filling film 120a and a spacer film 120b, respectively.

For example, a trench for burying the pixel isolation pattern 120, the first region isolation pattern 120I1, and the second region isolation pattern 120I2 may be formed inside the first substrate 110. The spacer film 120b may conformally extend along the side surfaces of the trench. The filling film 120a is formed on the spacer film 120b and may fill at least a part of the trench. That is, the spacer film 120b extends along the side surfaces of the filling film 120a and may separate the filling film 120a from the first substrate 110.

In some embodiments, the filling film 120a may include a conductive material. For example, the filling film 120a may include, but is not limited to, polysilicon (poly Si). In some embodiments, a ground voltage or a negative voltage may be applied to the filling film 120a containing the conductive material. In such a case, an ESD bruise defect of the image sensor may be prevented or reduced according to some embodiments. An ESD bruise defect means a phenomenon in which the electric charges generated by ESD or the like are accumulated on the surface (for example, the first side surface 110a) of the first substrate 110 to cause stains such as a bruise on an image to be generated.

The spacer film 120b may include an insulating material. Therefore, the spacer film 120b may electrically insulate the filling film 120a from the first substrate 110. In some embodiments, the spacer film 120b may include an oxide having a lower refractive index than the first substrate 110. For example, the spacer film 120b may include, but is not limited to, at least one of silicon oxide, aluminum oxide, tantalum oxide, and a combination thereof. The spacer film 120b, which has a lower refractive index than the first substrate 110, may refract or reflect light obliquely incident on the first photoelectric conversion units PD1L to PD4L or the second photoelectric conversion units PD1R to PD4R. Also, the spacer film 120b may prevent the light charges generated in a specific unit pixel by the incident light from moving to the adjacent unit pixel by a random drift. That is, the spacer film 120b increases the photo receiving rate of the first photoelectric conversion units PD1L to PD4L or the second photoelectric conversion units PD1R to PD4R, and may increase the quality of the image sensor according to some embodiments.

Figure 11:
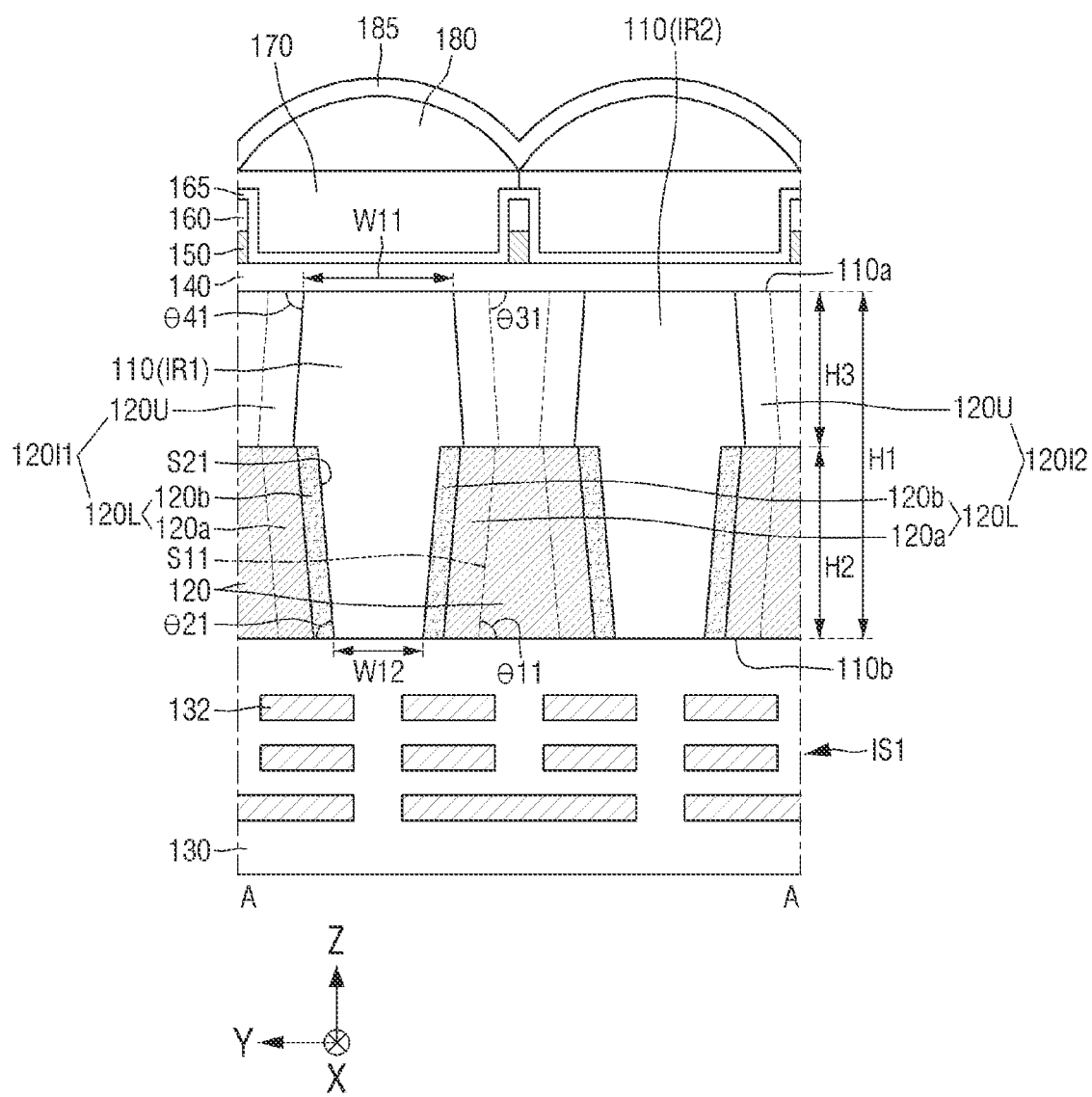
FIGS. 11 and 12 are cross-sectional views for describing an image sensor according to some embodiments.
Figure 12:
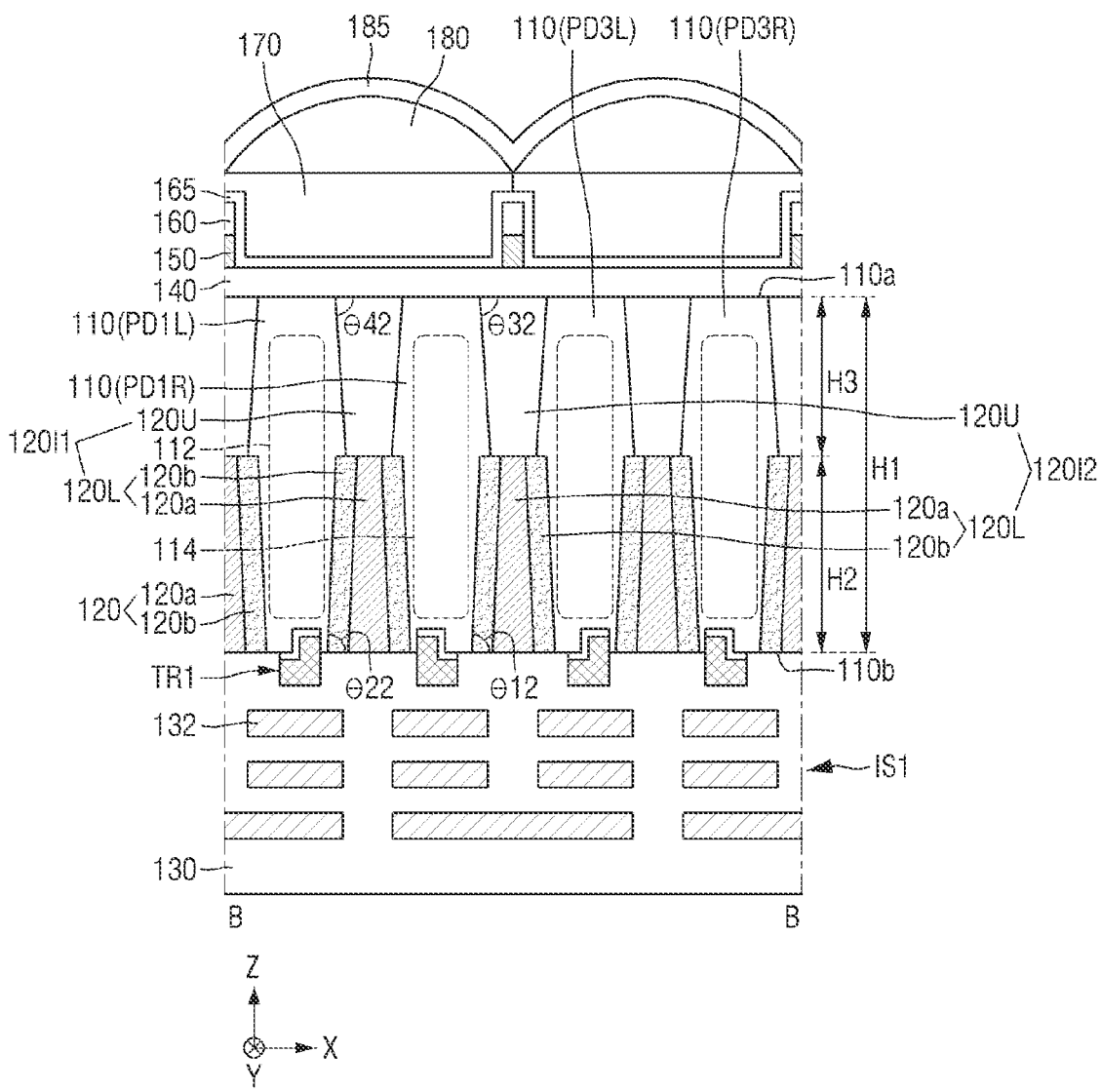

FIGS. 11 and 12 are cross-sectional views for describing an image sensor according to some embodiments. FIG. 11 is a cross-sectional view taken along line A-A of FIG. 3, and FIG. 12 is a cross-sectional view taken along line B-B of FIG. 3. For convenience of explanation, a further description of components and technical aspects previously described will be only briefly described or omitted.

Referring to FIGS. 3, 11 and 12, in an image sensor according to some embodiments, the pixel isolation pattern 120, the first region isolation pattern 120I1 and the second region isolation pattern 120I2 may include a lower isolation pattern 120L and an upper isolation pattern 120U, respectively.

The lower isolation pattern 120L may extend from the second side surface 110b of the first substrate 110. In some embodiments, the width of the lower isolation pattern 120L may decrease as it extends away from the second side surface 110b of the first substrate 110. For example, as shown in FIG. 11, the side surfaces of the lower isolation pattern 120L intersecting the second direction Y may form an acute angle (e.g., a first internal angle θ11 or a third internal angle θ21) with the second side surface 110b of the first substrate 110. Or, for example, as shown in FIG. 12, the side surfaces of the lower isolation pattern 120L intersecting the first direction X may form an acute angle (e.g., a second internal angle θ12 or a fourth internal angle θ22) with the second side surface 110b of the first substrate 110.

In some embodiments, the lower isolation pattern 120L may include a filling film 120a and a spacer film 120b. The filling film 120a may include a conductive material. For example, the filling film 120a may include, but is not limited to, polysilicon (poly Si). The spacer film 120b may include an insulating material. For example, the spacer film 120b may include, but is not limited to, at least one of silicon oxide, aluminum oxide, tantalum oxide, and a combination thereof.

The upper isolation pattern 120U may extend from the first side surface 110a of the first substrate 110. In some embodiments, the width of the upper isolation pattern 120U may decrease as it extends away from the first side surface 110a of the first substrate 110. For example, as shown in FIG. 11, the side surfaces of the upper isolation pattern 120U intersecting the second direction Y may form an acute angle (e.g., a seventh internal angle θ31 or a ninth internal angle θ41) with the first side surface 110a of the first substrate 110. Or, for example, as shown in FIG. 12, the side surfaces of the upper isolation pattern 120U intersecting the first direction X may form an acute angle (e.g., an eighth internal angle θ32 or a tenth internal angle θ42) with the first side surface 110a of the first substrate 110.

The upper isolation pattern 120U may include, for example, but is not limited to, at least one of silicon oxide, silicon nitride, silicon oxynitride, aluminum oxide, hafnium oxide, and combinations thereof.

Although the first internal angle θ11 and the seventh internal angle θ31 are shown as being the same, and the third internal angle θ21 and the ninth internal angle θ41 are shown as being the same, this is only an example, and embodiments of the present disclosure are not limited thereto. For example, in some embodiments, the first internal angle θ11 and the seventh internal angle θ31 may be different from each other and the third internal angle θ21 and the ninth internal angle θ41 may be different from each other to adjust the first width W11 and the second width W12 of the isolation regions IR1 to IR4. Also, although the second internal angle θ12 and the eighth internal angle θ32 are shown as being the same, and the fourth internal angle θ22 and the tenth internal angle θ42 are shown as being the same, this is only an example, and embodiments of the present disclosure are not limited thereto. For example, in some embodiments, the second internal angle θ12 and the eighth internal angle θ32 may be different from each other, and the fourth internal angle θ22 and the tenth internal angle θ42 may be different from each other to adjust the first width W11 and the second width W12 of the isolation regions IR1 to IR4.

Although a height H2 of the lower isolation pattern 120L is shown as being greater than a height H3 of the upper isolation pattern 120U, this is only an example, and embodiments of the present disclosure are not limited thereto. For example, in some embodiments, the height H2 of the lower isolation pattern 120L may be the same as or smaller than the height H3 of the upper isolation pattern 120U to adjust the first width W11 and the second width W12 of the isolation regions IR1 to IR4.

Figure 13:
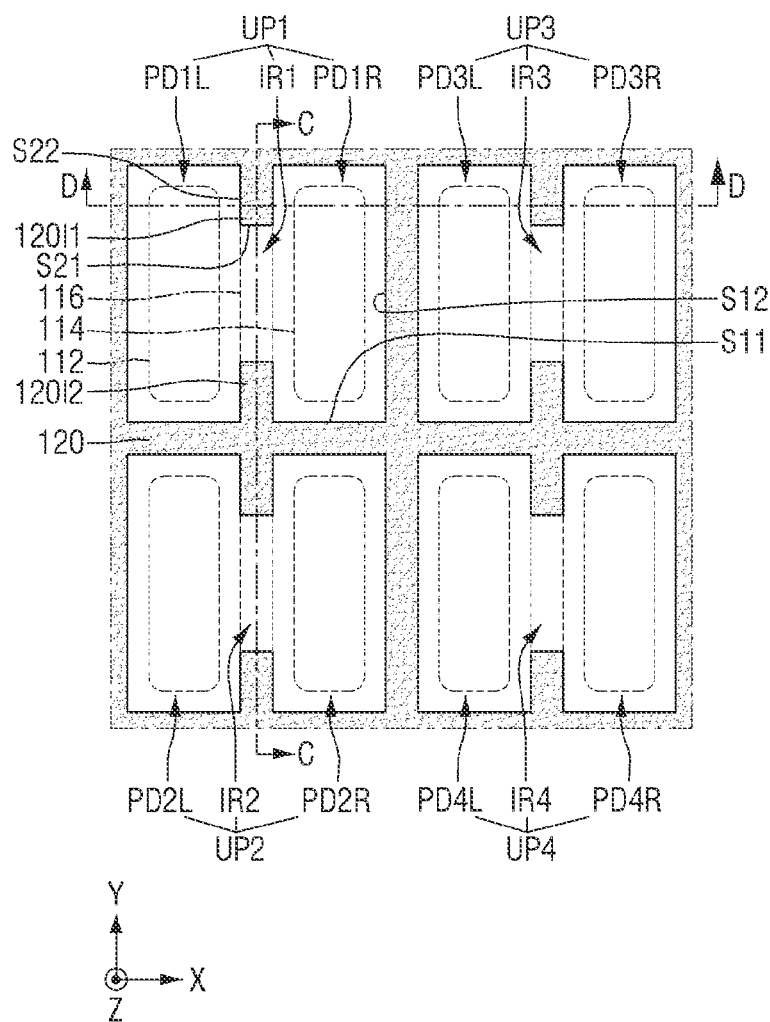
FIG. 13 is a layout diagram for describing unit pixels of an image sensor according to some embodiments.
Figure 14:
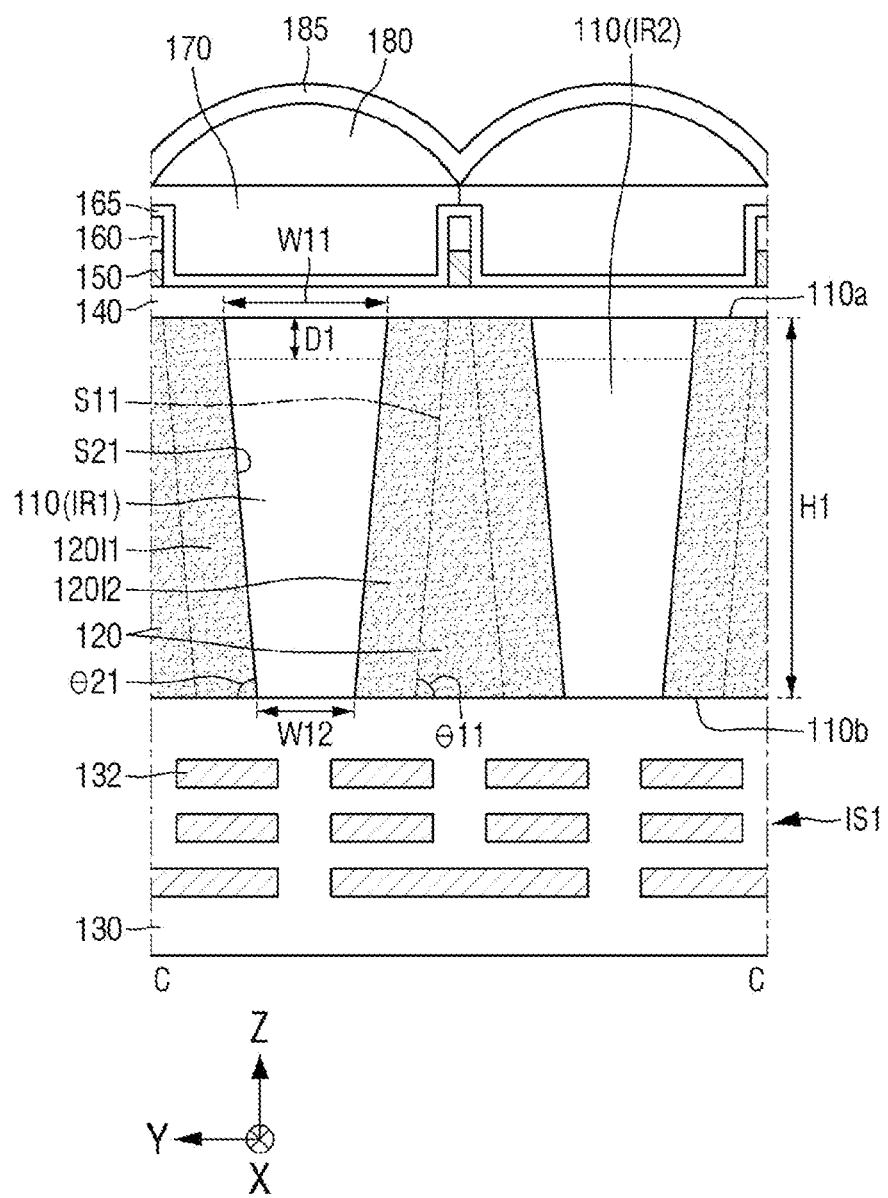
FIG. 14 is a cross-sectional view taken along line C-C of FIG. 13.
Figure 15:
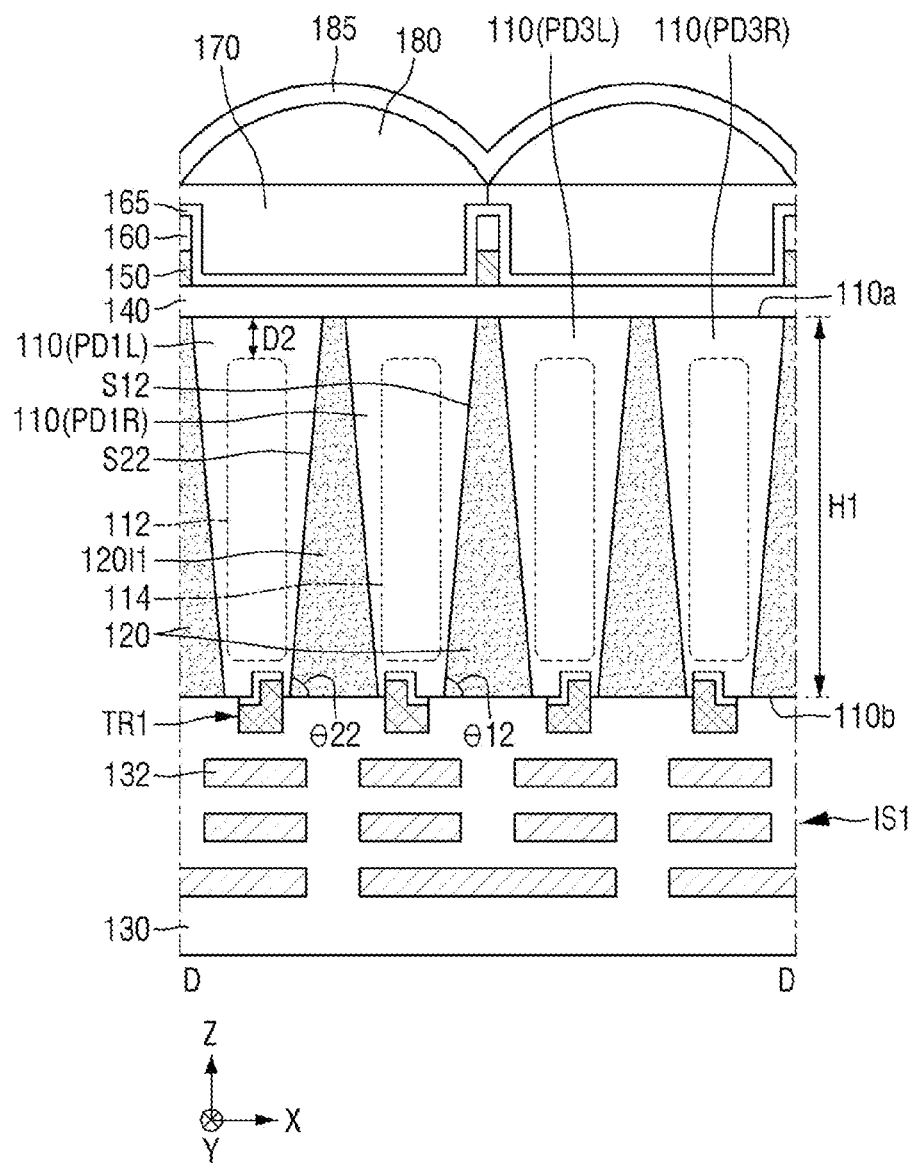
FIG. 15 is a cross-sectional view taken along line D-D of FIG. 13.

FIG. 13 is a layout diagram for describing unit pixels of an image sensor according to some embodiments. FIG. 14 is a cross-sectional view taken along line C-C of FIG. 13. FIG. 15 is a cross-sectional view taken along line D-D of FIG. 13. For convenience of explanation, a further description of components and technical aspects previously described will be only briefly described or omitted.

Referring to FIGS. 13 to 15, in an image sensor according to some embodiments, each of the unit pixels UP1 to UP4 may include an impurity region 116.

The impurity region 116 may be formed inside the isolation regions IR1 to IR4. That is, the impurity region 116 may be formed inside each of the unit pixels UP1 to UP4 between the first region isolation pattern 120I1 and the second region isolation pattern 120I2. The first region isolation pattern 120I1, the impurity region 116, and the second region isolation pattern 120I2 may be arranged sequentially along the second direction Y. Accordingly, the first photoelectric conversion units PD1L to PD4L and the second photoelectric conversion units PD1R to PD4R may be separated from each other by the first region isolation pattern 120I1, the impurity region 116, and the second region isolation pattern 120I2.

The impurity region 116 may include impurities of the first conductive type. For example, the impurity region 116 may include p-type impurities. Therefore, the impurity region 116 may further facilitate separation between the first photoelectric conversion units PD1L to PD4L and the second photoelectric conversion units PD1R to PD4R. For example, the impurity region 116 may prevent the electric charges of the first photoelectric conversion units PD1L to PD4L and the second photoelectric conversion units PD1R to PD4R from moving beyond the isolation regions IR1 to IR4.

In some embodiments, a first depth D1 at which the impurity region 116 is formed may be equal to or smaller than a second depth D2 at which a first photoelectric conversion region 112 and/or a second photoelectric conversion region 114 is formed. In such a case, the impurity region 116 may prevent the electric charges of the first photoelectric conversion region 112 and the second photoelectric conversion region 114 from moving beyond the isolation regions IR1 to IR4.

Figure 16:
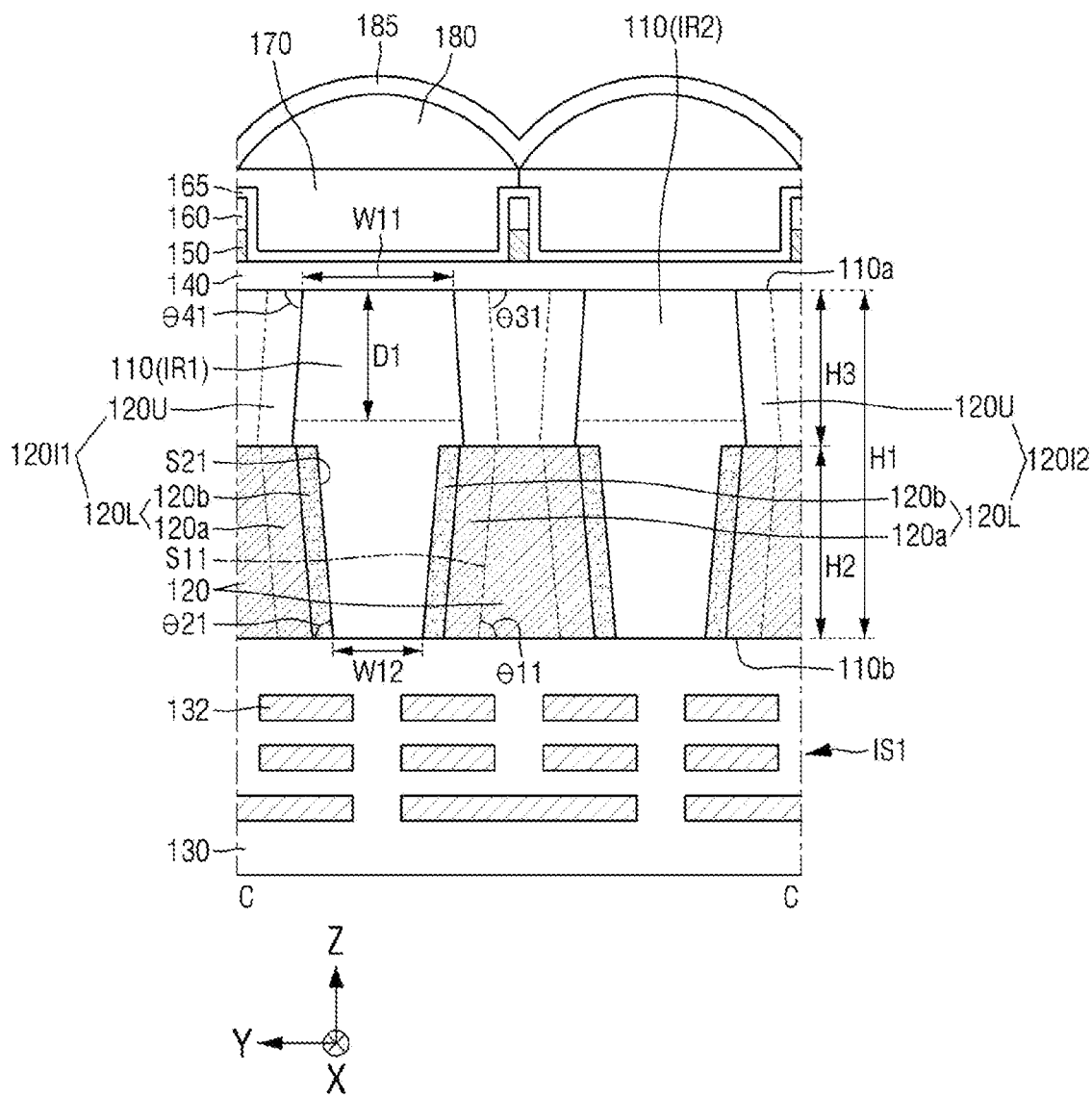
FIGS. 16 and 17 are cross-sectional views for describing an image sensor according to some embodiments.
Figure 17:
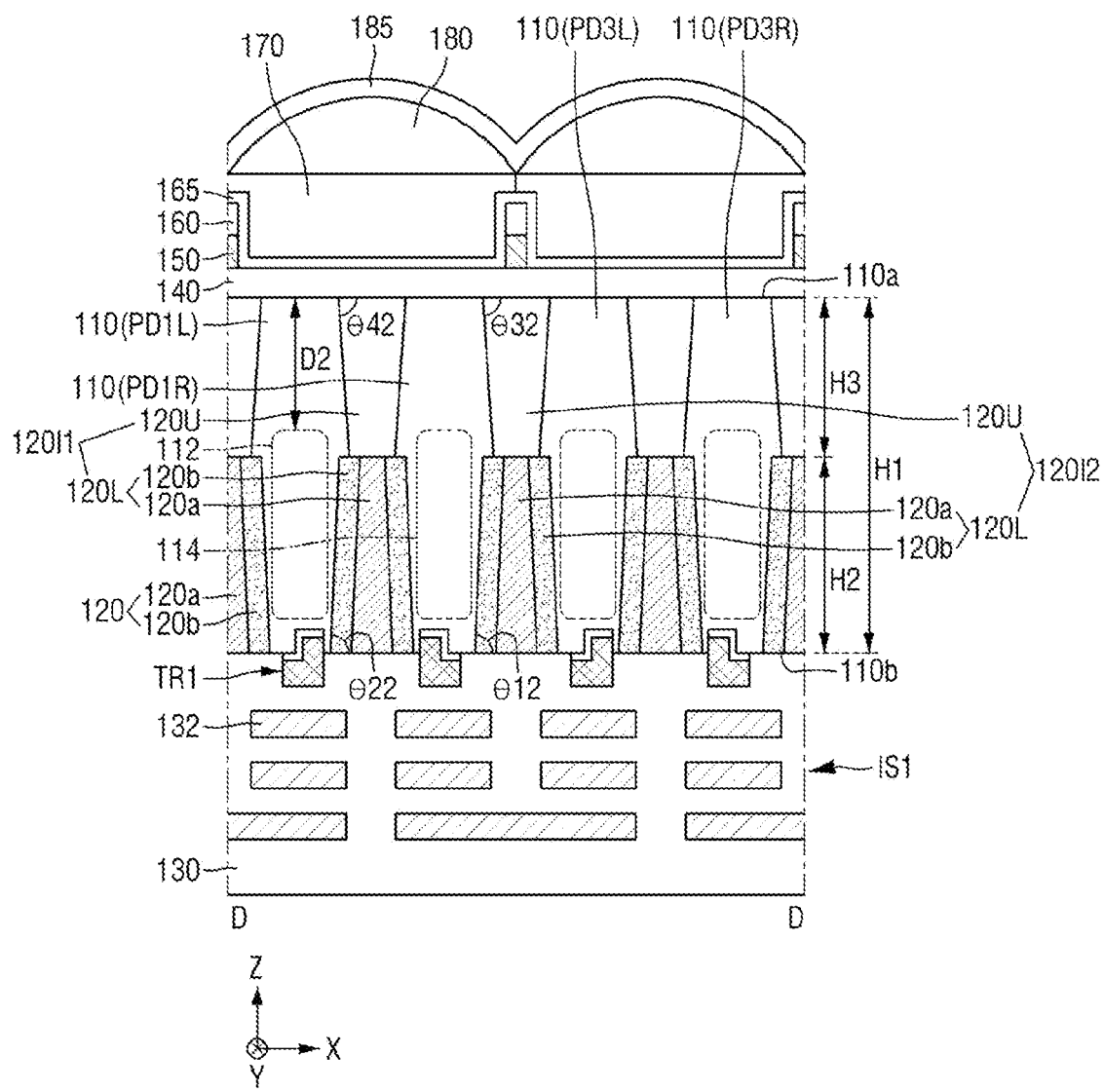

FIGS. 16 and 17 are cross-sectional views for describing an image sensor according to some embodiments. FIG. 16 is a cross-sectional view taken along line C-C of FIG. 13, and FIG. 17 is a cross-sectional view taken along line D-D of FIG. 13. For convenience of explanation, a further description of components and technical aspects previously described will be only briefly described or omitted.

Referring to FIGS. 13, 16 and 17, in an image sensor according to some embodiments, the first photoelectric conversion region 112 and/or the second photoelectric conversion region 114 may be closer to the second side surface 110*b* of the first substrate 110 than the first side surface 110*a* of the first substrate 110.

That is, the first photoelectric conversion region 112 and/or the second photoelectric conversion region 114 may be formed in a deep region of the first substrate 110. As an example, the second depth D2 at which the first photoelectric conversion region 112 and/or the second photoelectric conversion region 114 is formed may be about 2000 nm or more.

In some embodiments, the first depth D1 at which the impurity region 116 is formed may be equal to or smaller than the second depth D2 at which the first photoelectric conversion region 112 and/or the second photoelectric conversion region 114 is formed. In such a case, the impurity region 116 may prevent the electric charges of the first photoelectric conversion region 112 and the second photoelectric conversion region 114 from moving beyond the isolation regions IR1 to IR4.

Figure 18:
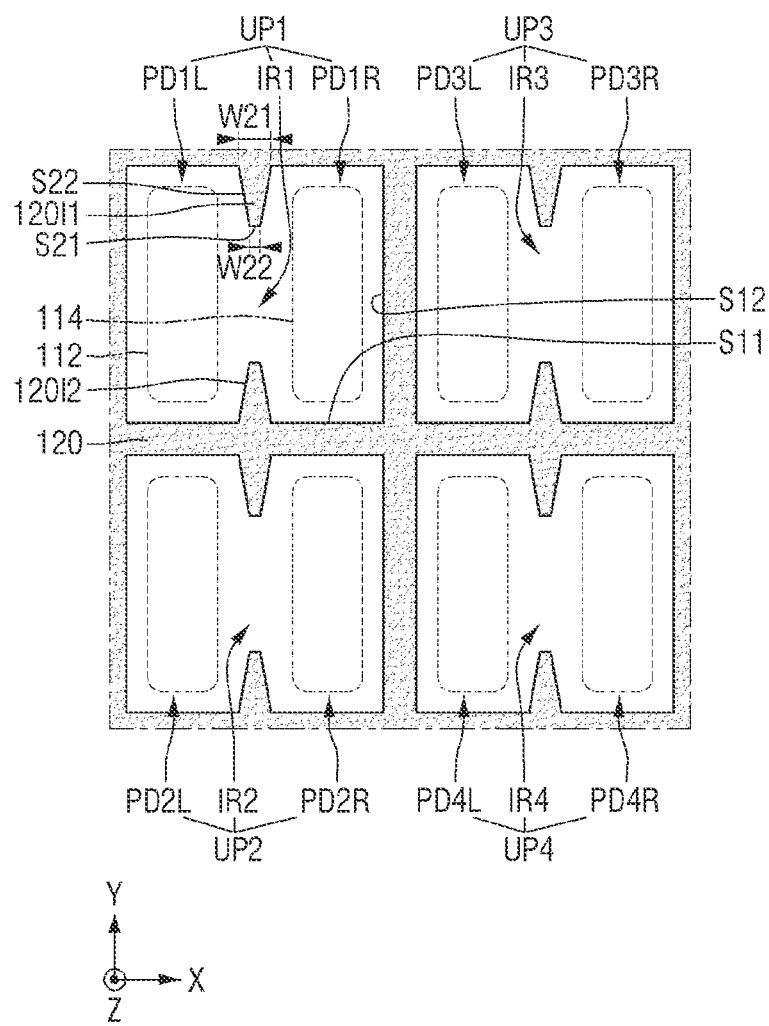
FIGS. 18 and 19 are various layout diagrams for describing unit pixels of an image sensor according to some embodiments.
Figure 19:
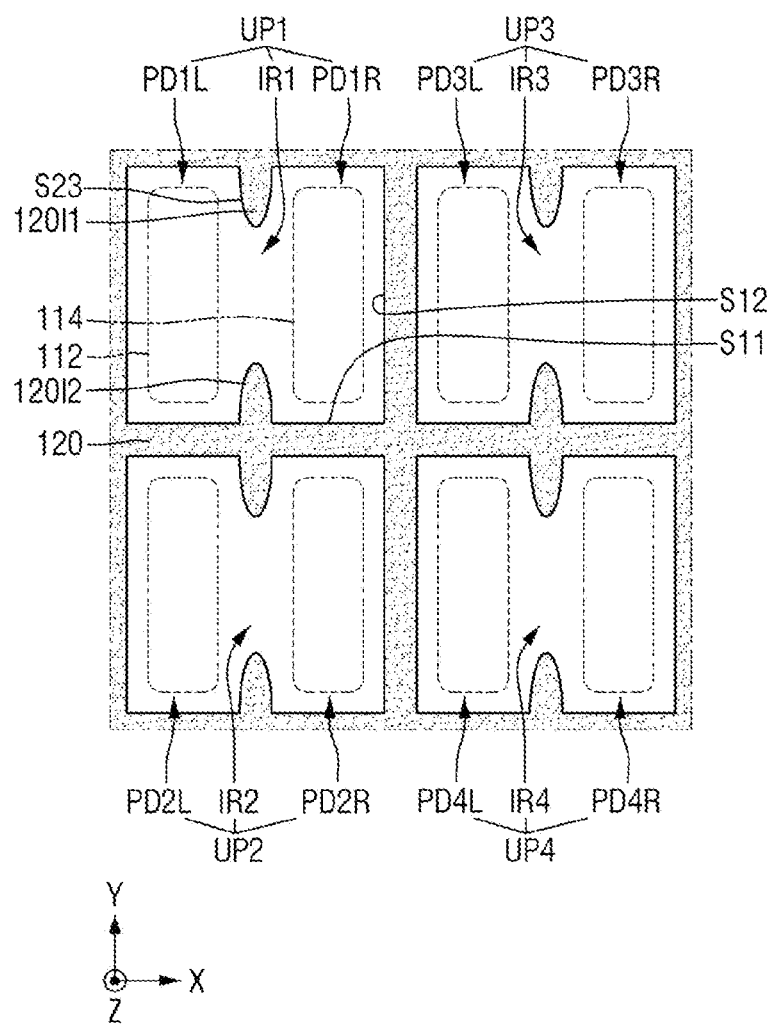

FIGS. 18 and 19 are various layout diagrams for describing the unit pixels of the image sensor according to some embodiments. For convenience of explanation, a further description of components and technical aspects previously described will be only briefly described or omitted.

Referring to FIGS. 18 and 19, in an image sensor according to some embodiments, the width of the first and second region isolation patterns 120I1 and 120I2 in the first direction X may decrease, as it extends away from the pixel isolation pattern 120.

For example, a third width W21 of the first region isolation pattern 120I1 adjacent to the pixel isolation pattern 120 in the first direction X may be greater than a fourth width W22 of the first region isolation pattern 120I1 separated from the pixel isolation pattern 120 in the first direction X.

Referring to FIG. 18, the first and second region isolation patterns 120I1 and 120I2 may each have a trapezoidal shape from a planar viewpoint.

Referring to FIG. 19, each of the first and second region isolation patterns 120I1 and 120I2 may have a semi-elliptical shape from a planar viewpoint. For example, the first region isolation pattern 120I1 may include a fifth side surface S23 that forms a curved surface.

Figure 20:
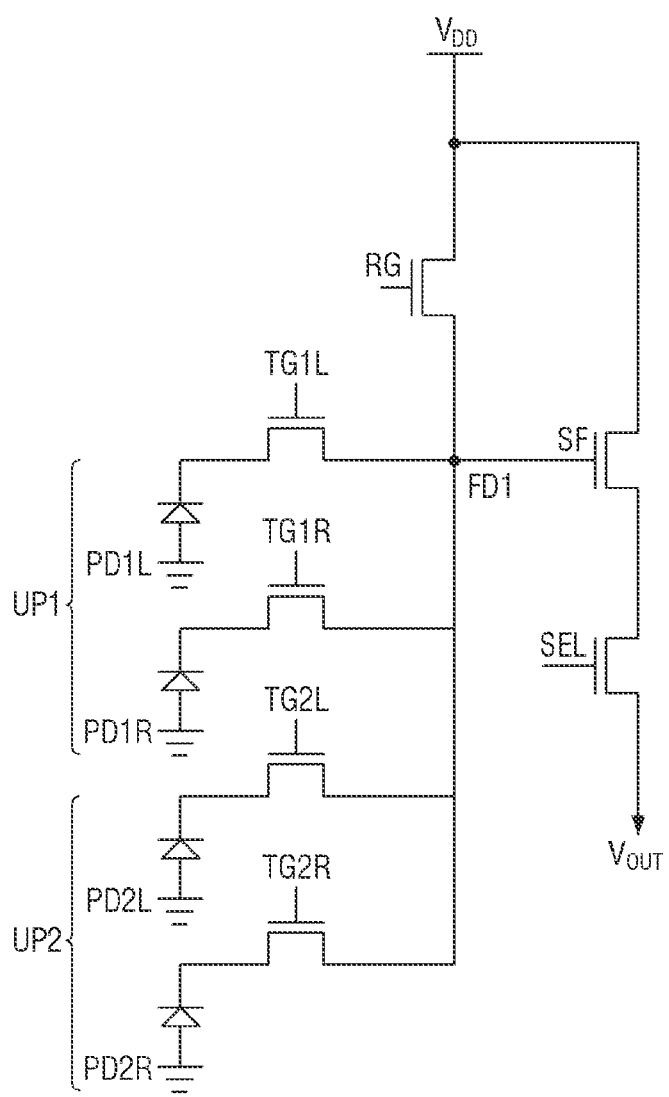
FIG. 20 is an exemplary circuit diagram for describing an image sensor according to some embodiments.

FIG. 20 is an exemplary circuit diagram for describing an image sensor according to some embodiments. For convenience of explanation, a further description of components and technical aspects previously described will be only briefly described or omitted.

Referring to FIG. 20, in an image sensor according to some embodiments, at least some of the unit pixels UP1 to UP4 may share the floating diffusion region FD1.

For example, as shown, two unit pixels (the first unit pixel UP1 and the second unit pixel UP2) may share the floating diffusion region FD1. That is, the first and second transfer gates TG1L and TG1R of the first unit pixel UP1, and the third and fourth transfer gates TG2L and TG2R of the second unit pixel UP2, may share the floating diffusion region FD1.

In some embodiments, four unit pixels (e.g., the first to fourth unit pixels UP1, UP2, UP3 and UP4) may share the floating diffusion region FD1.

Figure 21:
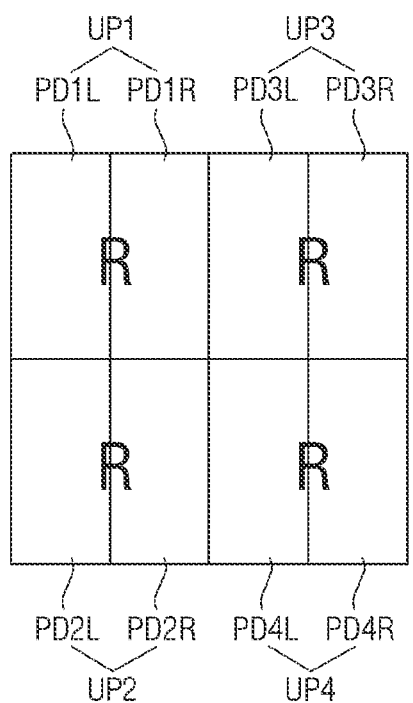
FIGS. 21 and 22 are various layout diagrams for describing a color arrangement of unit pixels of an image sensor according to some embodiments.
Figure 22:
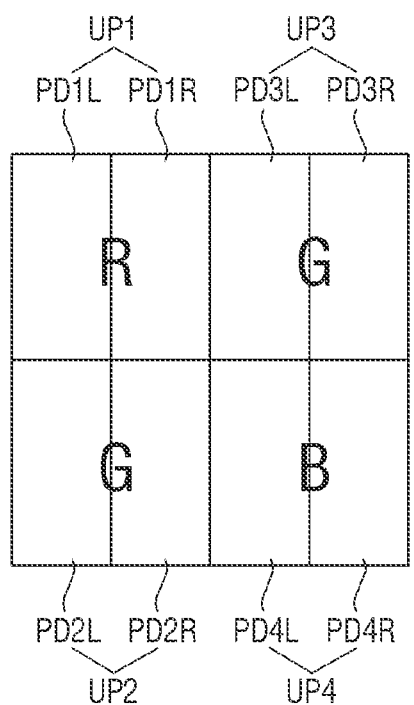

FIGS. 21 and 22 are various layout diagrams for describing a color arrangement of the unit pixels of an image sensor according to some embodiments. For convenience of explanation, a further description of components and technical aspects previously described will be only briefly described or omitted.

Referring to FIG. 21, in an image sensor according to some embodiments, the first to fourth unit pixels UP1, UP2, UP3 and UP4 may be arranged in the form of a tetra pattern.

The tetra pattern may include an array in which four unit pixels have the same color. In FIG. 21, although all the first to fourth unit pixels UP1, UP2, UP3 and UP4 are only shown as having the color red R, embodiments of the present disclosure are not limited thereto. For example, in some embodiments, all of the first to fourth unit pixels UP1, UP2, UP3 and UP4 may be green G or blue B, or may include colors other than red R, green G, and blue B.

Referring to FIG. 22, in an image sensor according to some embodiments, the first to fourth unit pixels UP1, UP2, UP3 and UP4 may be arranged in the form of a Bayer pattern.

The Bayer pattern may include a first row in which red R and green G unit pixels are placed repeatedly, and a second row in which green G and blue B unit pixels are placed repeatedly. However, this is only an example, and embodiments of the present disclosure are not limited thereto. For example, in some embodiments, the first to fourth unit pixels UP1, UP2, UP3 and UP4 may include colors other than red R, green G, and blue B.

Figure 23:
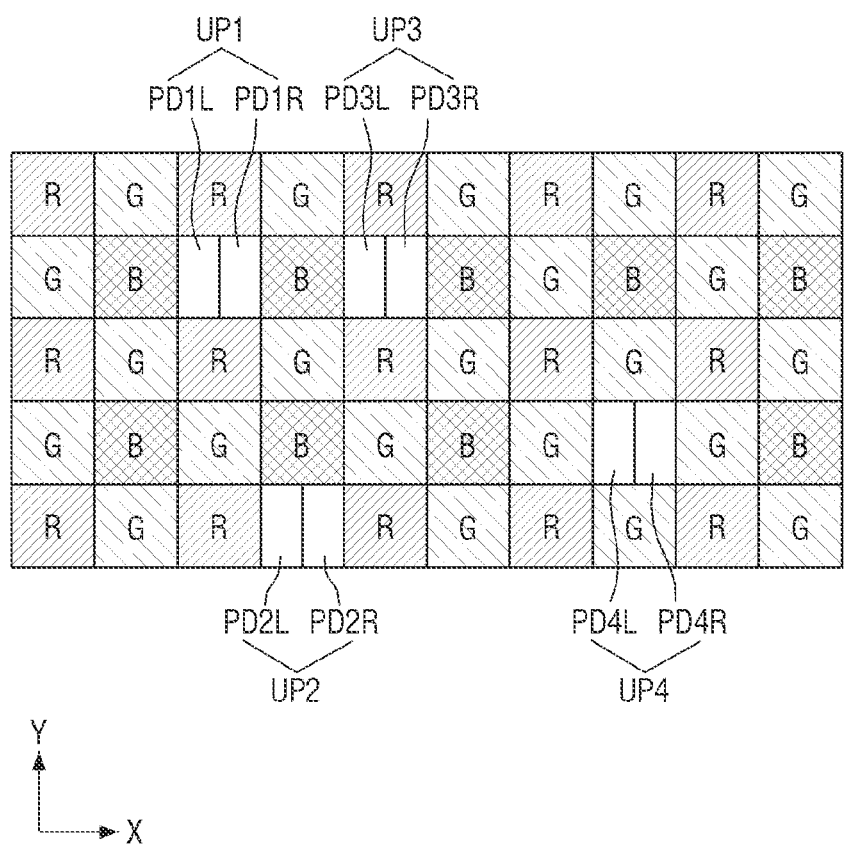
FIGS. 23 and 24 are various layout diagrams for describing an arrangement of unit pixels of an image sensor according to some embodiments.
Figure 24:
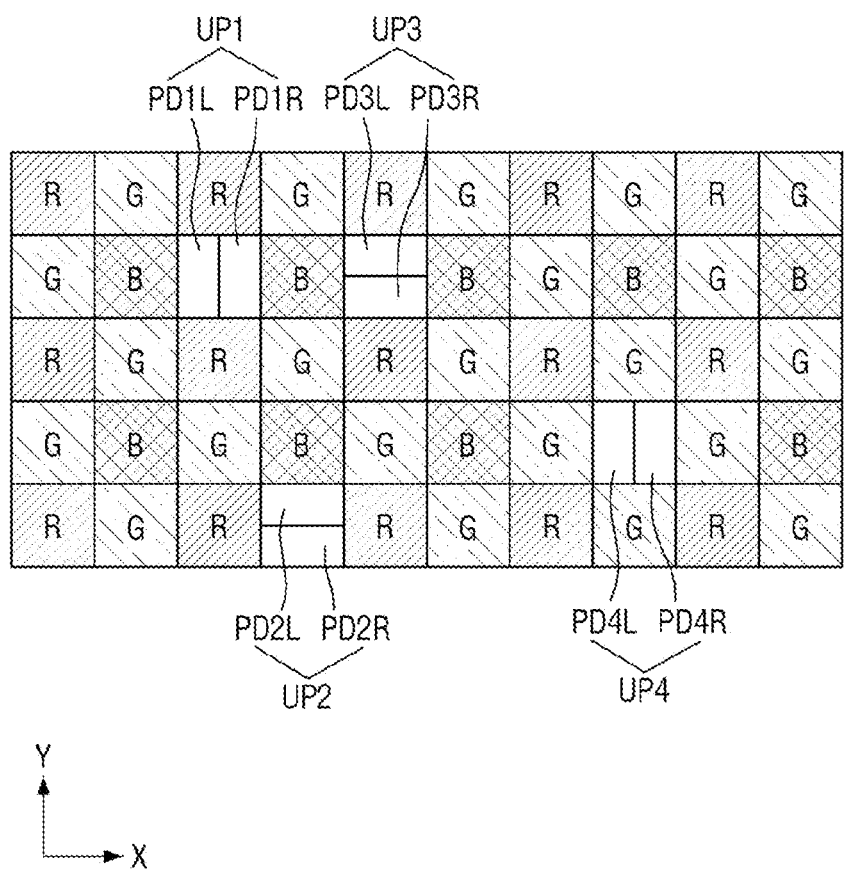

FIGS. 23 and 24 are various layout diagrams for describing the arrangement of unit pixels of an image sensor according to some embodiments. For convenience of explanation, a further description of components and technical aspects previously described will only be briefly described or omitted.

Referring to FIGS. 23 and 24, an image sensor according to some embodiments includes a plurality of unit pixels arranged two-dimensionally (e.g., in the form of a matrix) in a plane defined by the first direction X and the second direction Y.

The plurality of unit pixels may be arranged, for example, in the form of a Bayer pattern. The Bayer pattern may include a first row in which red R and green G unit pixels are placed repeatedly, and a second row in which green G and blue B unit pixels are placed repeatedly. However, this is only an example, and embodiments of the present disclosure are not limited thereto. For example, in some embodiments, the plurality of unit pixels may be arranged in a pattern other than the Bayer pattern or may have colors other than red R, green G, and blue B.

Referring to FIG. 23, the plurality of unit pixels may include the unit pixels described above (e.g., the first to fourth unit pixels UP1, UP2, UP3 and UP4) with reference to FIGS. 1 to 22. For example, the plurality of unit pixels may include the first photoelectric conversion units PD1L to PD4L and the second photoelectric conversion units PD1R to PD4R described above with reference to FIGS. 1 to 22.

In some embodiments, the first to fourth unit pixels UP1, UP2, UP3 and UP4 may replace some of the unit pixels having the color green G. However, this is only an example, and embodiments of the present disclosure are not limited thereto. For example, in some embodiments, the first to fourth unit pixels UP1, UP2, UP3 and UP4 may replace some of the unit pixels having the color red R or some of unit pixels having the color blue B.

In some embodiments, at least some of the first to fourth unit pixels UP1, UP2, UP3 and UP4 may perform an autofocus (AF) function. For example, since the first unit pixel UP1 may include a first photoelectric conversion unit PD1L and a second photoelectric conversion unit PD1R, the autofocus function may be executed using a phase detection AF (PDAF) function.

Referring to FIG. 24, at least some of the first to fourth unit pixels UP1, UP2, UP3 and UP4 may include the first photoelectric conversion units PD1L to PD4L and the second photoelectric conversion units PD1R to PD4R arranged in the second direction Y. For example, the first unit pixel UP1 and the fourth unit pixel UP4 may include the first photoelectric conversion units PD1L and PD4L and the second photoelectric conversion units PD1R and PD4R arranged in the first direction X. The second unit pixel UP2 and the third unit pixel UP3 may include the first photoelectric conversion units PD2L and PD3L and the second photoelectric conversion units PD2R and PD3R arranged in the second direction Y.

Figure 25:
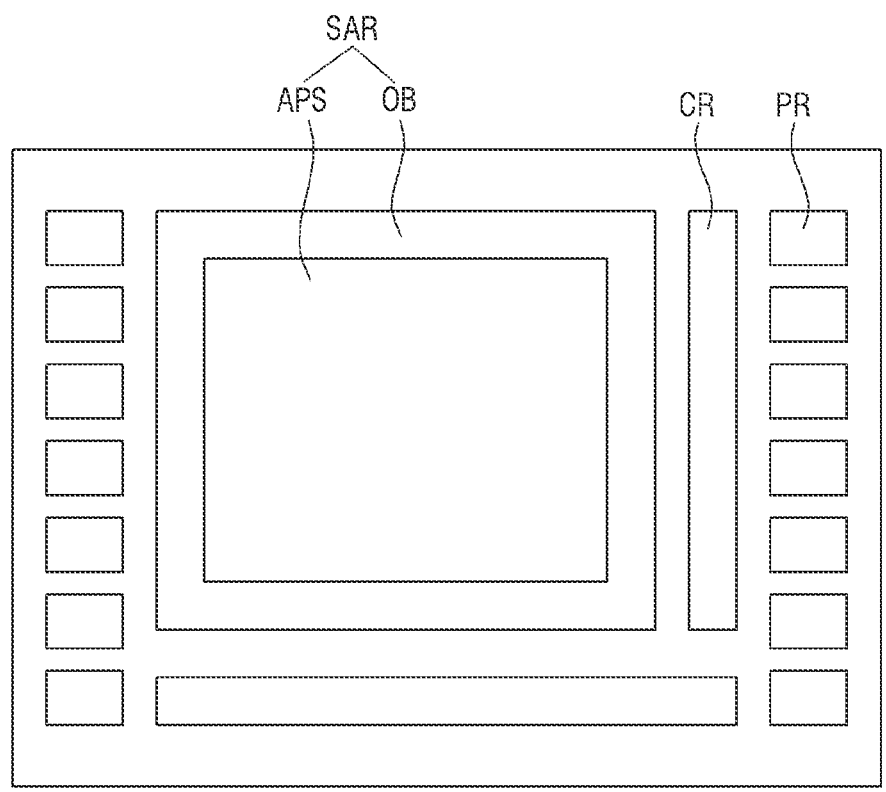
FIG. 25 is a schematic layout diagram for describing an image sensor according to some embodiments.
Figure 26:
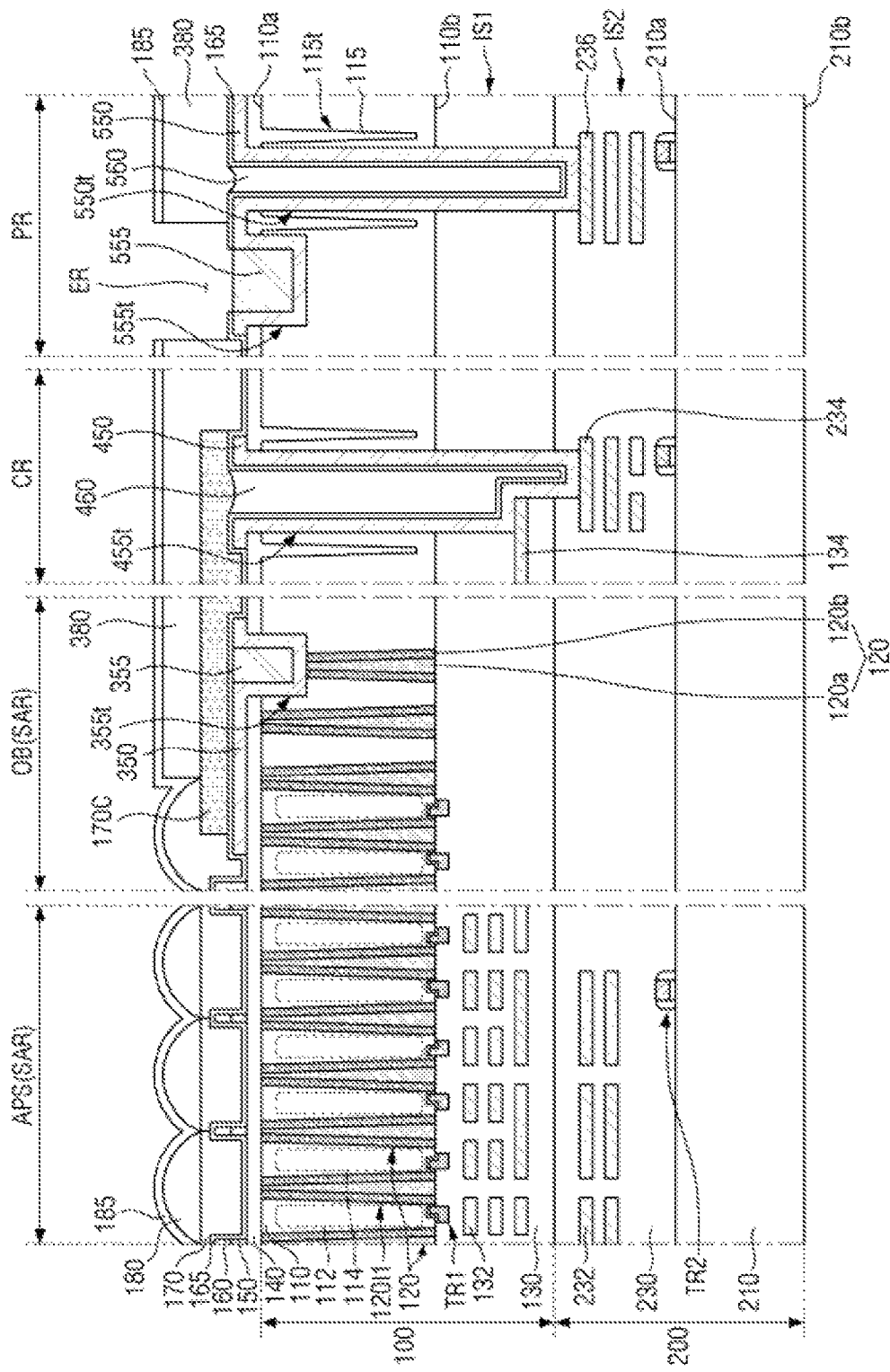
FIG. 26 is a schematic cross-sectional view for describing an image sensor according to some embodiments.

FIG. 25 is a schematic layout diagram for describing an image sensor according to some embodiments. FIG. 26 is a schematic cross-sectional view for describing the image sensor according to some embodiments. For convenience of explanation, a further description of components and technical aspects previously described will be only briefly described or omitted.

Referring to FIGS. 25 and 26, the image sensor according to some embodiments may include a sensor array region SAR, a connection region CR and a pad region PR.

The sensor array region SAR may include a region corresponding to the active pixel sensor array 10 of FIG. 1. For example, a plurality of unit pixels (for example, UP1 to UP4 of FIG. 3) arranged two-dimensionally (for example, in the form of a matrix) may be formed in the sensor array region SAR.

The sensor array region SAR may include a photo receiving region APS and a photo shielding region OB. Active pixels that receive light and generate an active signal may be arranged in the photo receiving region APS. Optical black pixels that block light and generate an optical black signal may be arranged in the photo shielding region OB. Although the photo shielding region OB may be formed, for example, along the periphery of the photo receiving region APS, this is only an example, and embodiments of the present disclosure are not limited thereto.

In some embodiments, the photoelectric conversion regions 112 and 114 are not formed in a part of the photo shielding region OB. For example, in some embodiments, the photoelectric conversion regions 112 and 114 may be formed in the first substrate 110 of the photo shielding region OB adjacent to the photo receiving region APS, but are not formed in the first substrate 110 of the photo shielding region OB separated from the photo receiving region APS.

In some embodiments, dummy pixels may be formed in the photo receiving region APS adjacent to the photo shielding region OB.

The connection region CR may be formed around the sensor array region SAR. Although the connection region CR may be formed on one side of the sensor array region SAR, this is only an example, and embodiments of the present disclosure are not limited thereto. Wirings may be formed in the connection region CR and may be configured to transmit and receive electrical signals of the sensor array region SAR.

The pad region PR may be formed around the sensor array region SAR. Although the pad region PR may be adjacent to the edge of the image sensor according to some embodiments, this is only an example, and embodiments of the present disclosure are not limited thereto. The pad region PR may be connected to an external device or the like, and configured to transmit and receive electrical signals between the image sensor according to some embodiments and the external device.

Although the connection region CR is shown as being interposed between the sensor array region SAR and the pad region PR, this is only an example, and embodiments of the present disclosure are not limited thereto. That is, according to embodiments, the arrangement of the sensor array region SAR, the connection region CR, and the pad region PR may be varied as needed.

In an image sensor according to some embodiments, the first substrate 110 and the first wiring structure IS1 may form the first substrate structure 100.

In some embodiments, the first wiring structure IS1 may include a first wiring 132 in the sensor array region SAR, and a second wiring 134 in the connection region CR. The first wiring 132 may be electrically connected to the unit pixels (e.g., UP1 to UP4 of FIG. 3) of the sensor array region SAR. For example, the first wiring 132 may be connected to the first electronic element TR1. At least a part of the second wiring 134 may extend from the sensor array region SAR. For example, at least a part of the second wiring 134 may be electrically connected to at least a part of the first wiring 132. Therefore, the second wiring 134 may be electrically connected to the unit pixels (e.g., UP1 to UP4 of FIG. 3) of the sensor array region SAR.

The image sensor according to some embodiments may include a second substrate 210 and a second wiring structure IS2.

The second substrate 210 may be, for example, bulk silicon or SOI (silicon-on-insulator). In some embodiments, the second substrate 210 may be a silicon substrate or may include other materials such as, for example, silicon germanium, indium antimonide, lead tellurium compounds, indium arsenic, indium phosphide, gallium arsenide or gallium antimonide. In some embodiments, the second substrate 210 may be an epitaxial layer formed on the base substrate.

The second substrate 210 may include a third side 210a and a fourth side 210b that are opposite to each other. In some embodiments, the third side 210a of the second substrate 210 may be a side that faces the second side surface 110b of the first substrate 110.

A plurality of electronic elements may be formed on the second substrate 210. For example, the second electronic element TR2 may be formed on the third side 210a of the second substrate 210. The second electronic element TR2 is electrically connected to the sensor array region SAR, and may transmit and receive electrical signals to and from each unit pixel (e.g., UP1 to UP4 of FIG. 3) of the sensor array region SAR. For example, the second electronic element TR2 may include electronic elements that constitute the row decoder 20, the row driver 30, the column decoder 40, the timing generator 50, the correlated double sampler 60, the analog-to-digital converter 70 or the input/output buffer 80 of FIG. 1.

The second wiring structure IS2 may be formed on the second substrate 210. In some embodiments, the second wiring structure IS2 may be formed on the third side 210a of the second substrate 210. The second substrate 210 and the second wiring structure IS2 may form the second substrate structure 200.

The second wiring structure IS2 may be attached to the first wiring structure IS1. For example, as shown in FIG. 26, the upper surface of the second wiring structure IS2 may be attached to the lower surface of the first wiring structure IS1.

The second wiring structure IS2 may be made up of one wiring or a plurality of wirings. For example, the second wiring structure IS2 may include a second inter-wiring insulating film 230, and a plurality of wirings 232, 234 and 236 in the second inter-wiring insulating film 230. In FIG. 26, the number of layers of the wirings constituting the second wiring structure IS2 and the arrangement thereof are only an example, and are not limited thereto.

At least some of the wirings 232, 234 and 236 of the second wiring structure IS2 may be connected to the second electronic element TR2. In some embodiments, the second wiring structure IS2 may include a third wiring 232 in the sensor array region SAR, a fourth wiring 234 in the connection region CR, and a fifth wiring 236 in the pad region PR. In some embodiments, the fourth wiring 234 may be an uppermost wiring among the plurality of wirings in the connection region CR, and the fifth wiring 236 may be an uppermost wiring among the plurality of wirings in the pad region PR.

The image sensor according to some embodiments may include a first connection structure 350, a second connection structure 450, and a third connection structure 550.

The first connection structure 350 may be formed inside the photo shielding region OB. The first connection structure 350 may be formed on the surface insulating film 140 of the photo shielding region OB. In some embodiments, the first connection structure 350 may come into contact with the pixel isolation pattern 120. For example, a first trench 355t that exposes the pixel isolation pattern 120 may be formed inside the first substrate 110 and the surface insulating film 140 of the photo shielding region OB. The first connection structure 350 is formed inside the first trench 355t and may come into contact with the pixel isolation pattern 120 in the photo shielding region OB. In some embodiments, the first connection structure 350 may extend along the profiles of the side surfaces and the lower surface of the first trench 355t.

The first connection structure 350 may include, for example, but is not limited to, at least one of titanium (Ti), titanium nitride (TiN), tantalum (Ta), tantalum nitride (TaN), tungsten (W), aluminum (Al), copper (Cu), and combinations thereof.

In some embodiments, the first connection structure 350 is electrically connected to the pixel isolation pattern 120 and may apply a ground voltage or a negative voltage to the pixel isolation pattern 120. Accordingly, electric charges generated by ESD or the like may be discharged to the first connection structure 350 through the pixel isolation pattern 120, and ESD bruise defects can be prevented or reduced.

In some embodiments, a first pad 355 that fills the first trench 355t may be formed on the first connection structure 350. The first pad 355 may include, for example, but is not limited to, at least one of tungsten (W), copper (Cu), aluminum (Al), gold (Au), silver (Ag), and alloys thereof.

In some embodiments, the first protective film 165 may cover the first connection structure 350 and the first pad 355. For example, the first protective film 165 may extend along the profiles of the first connection structure 350 and the first pad 355.

The second connection structure 450 may be formed inside the connection region CR. The second connection structure 450 may be formed on the surface insulating film 140 of the connection region CR. The second connection structure 450 may electrically connect the first substrate structure 100 and the second substrate structure 200. For example, a second trench 455t that exposes the second wiring 134 and the fourth wiring 234 may be formed inside the first substrate structure 100 and the second substrate structure 200 of the connection region CR. The second connection structure 450 is formed inside the second trench 455t and may connect the second wiring 134 and the fourth wiring 234. In some embodiments, the second connection structure 450 may extend along the profiles of the side surfaces and the lower surface of the second trench 455t.

The second connection structure 450 may include, for example, but is not limited to, at least one of titanium (Ti), titanium nitride (TiN), tantalum (Ta), tantalum nitride (TaN), tungsten (W), aluminum (Al), copper (Cu) and combinations thereof. In some embodiments, the second connection structure 450 may be formed at the same level as the first connection structure 350.

In some embodiments, the first protective film 165 may cover the second connection structure 450. For example, the first protective film 165 may extend along the profile of the second connection structure 450.

In some embodiments, a first filling insulating film 460 that fills the second trench 455t may be formed on the second connection structure 450. The first filling insulating film 460 may include, for example, but is not limited to, at least one of silicon oxide, aluminum oxide, tantalum oxide, and a combination thereof.

The third connection structure 550 may be formed inside the pad region PR. The third connection structure 550 may be formed on the surface insulating film 140 of the pad region PR. The third connection structure 550 may electrically connect the second substrate structure 200 to an external device or the like.

For example, a third trench 550t that exposes the fifth wiring 236 may be formed inside the first substrate structure 100 and the second substrate structure 200 of the pad region PR. The third connection structure 550 is formed inside the third trench 550t and may come into contact with the fifth wiring 236. Also, a fourth trench 555t may be formed inside the first substrate 110 of the pad region PR. The third connection structure 550 may be formed inside the fourth trench 555t and exposed. In some embodiments, the third connection structure 550 may extend along the profiles of the side surfaces and the lower surfaces of the third trench 550t and the fourth trench 555t.

The third connection structure 550 may include, for example, but is not limited to, at least one of titanium (Ti), titanium nitride (TiN), tantalum (Ta), tantalum nitride (TaN), tungsten (W), aluminum (Al), copper (Cu) and combinations thereof. In some embodiments, the third connection structure 550 may be formed at the same level as the first connection structure 350 and the second connection structure 450.

In some embodiments, a second filling insulating film 560 that fills the third trench 550t may be formed on the third connection structure 550. The second filling insulating film 560 may include, for example, but is not limited to, at least one of silicon oxide, aluminum oxide, tantalum oxide, and a combination thereof. In some embodiments, the second filling insulating film 560 may be formed at the same level as the first filling insulating film 460.

In some embodiments, a second pad 555 that fills the fourth trench 555t may be formed on the third connection structure 550. The second pad 555 may include, for example, but is not limited to, at least one of tungsten (W), copper (Cu), aluminum (Al), gold (Au), silver (Ag), and alloys thereof. In some embodiments, the second pad 555 may be formed at the same level as the first pad 355.

In some embodiments, the first protective film 165 may cover the third connection structure 550. For example, the first protective film 165 may extend along the profile of the third connection structure 550. In some embodiments, the first protective film 165 may expose the second pad 555.

In some embodiments, the element isolation pattern 115 may be formed inside the first substrate 110. For example, an element isolation trench 115t may be formed in the first substrate 110. The element isolation pattern 115 may be formed in the element isolation trench 115t.

Although FIG. 26 shows that the element isolation pattern 115 is formed only around the second connection structure 450 of the connection region CR and around the third connection structure 550 of the pad region PR, this is only an example, and embodiments of the present disclosure are not limited thereto. For example, in some embodiments, the element isolation pattern 115 may be formed around the first connection structure 350 of the photo shielding region OB.

The element isolation pattern 115 may include, for example, but is not limited to, at least one of silicon oxide, silicon nitride, silicon oxynitride, aluminum oxide, hafnium oxide, and combinations thereof. In some embodiments, the element isolation pattern 115 may be formed at the same level as the surface insulating film 140.

In some embodiments, a photo shielding color filter 170C may be formed on the first connection structure 350 and the second connection structure 450. For example, the photo shielding color filter 170C may be formed to cover a part of the first protective film 165 in the photo shielding region OB and the connection region CR. The photo shielding color filter 170C may include, for example, but is not limited to, a blue color filter.

In some embodiments, a third protective film 380 may be formed on the photo shielding color filter 170C. For example, the third protective film 380 may be formed to cover a part of the first protective film 165 in the photo shielding region OB, the connection region CR, and the pad region PR. In some embodiments, the second protective film 185 may extend along the surface of the third protective film 380. The third protective film 380 may include, for example, but is not limited to, a light transmitting resin. In some embodiments, the third protective film 380 may include the same material as the microlens 180.

In some embodiments, the second protective film 185 and the third protective film 380 may expose the second pad 555. For example, an exposure opening ER that exposes the second pad 555 may be formed inside the second protective film 185 and the third protective film 380. Accordingly, the second pad 555 is connected to an external device or the like, and may be configured to transmit and receive an electrical signal between the image sensor according to some embodiments and an external device. That is, the second pad 555 may be an input/output pad of the image sensor according to some embodiments.

While the present disclosure has been particularly shown and described with reference to the embodiments thereof, it will be understood by those of ordinary skill in the art that various changes in form and detail may be made therein without departing from the spirit and scope of the present disclosure as defined by the following claims.

What is claimed is:

1. An image sensor, comprising:
   a substrate comprising a first side on which light is incident, and a second side opposite to the first side;
   a pixel isolation pattern formed inside the substrate which defines a plurality of unit pixels;
   a first photoelectric conversion region and a second photoelectric conversion region arranged along a first direction, inside each of the unit pixels; and
   a region isolation pattern which protrudes from the pixel isolation pattern in a second direction intersecting the first direction, and defines an isolation region between the first photoelectric conversion region and the second photoelectric conversion region,
   wherein a first width of the isolation region in the second direction on the first side is more than about 1.1 times a second width of the isolation region in the second direction on the second side,
   wherein the region isolation pattern includes a first side surface which intersects the second direction, and the first side surface of the region isolation pattern forms a first internal angle, which is an acute angle, with the second side of the substrate, and
   wherein the region isolation pattern further includes a second side surface which intersects the first direction, and the second side surface of the region isolation pattern forms a second internal angle, which is an acute angle greater than the first internal angle, with the second side of the substrate.

2. The image sensor of claim 1, wherein a width of the isolation region in the second direction increases from the second side of the substrate toward the first side of the substrate.

3. The image sensor of claim 1, wherein a width of the region isolation pattern in the first direction decreases as it extends away from the pixel isolation pattern.

4. The image sensor of claim 1, wherein a side surface of the pixel isolation pattern forms a third internal angle, which is an acute angle greater than the first internal angle, with the second side of the substrate.

5. The image sensor of claim 1, wherein each of the pixel isolation pattern and the region isolation pattern comprises:
   a filling film including a conductive material; and
   a spacer film which extends along side surfaces of the filling film and separates the filling film from the substrate.

6. The image sensor of claim 1, wherein
   each of the pixel isolation pattern and the region isolation pattern includes a lower isolation pattern extending from the second side of the substrate, and an upper isolation pattern extending from the first side of the substrate,
   a width of the lower isolation pattern decreases as it extends away from the second side of the substrate, and
   a width of the upper isolation pattern decreases as it extends away from the first side of the substrate.

7. The image sensor of claim 6, wherein the lower isolation pattern comprises:
   a filling film including a conductive material; and
   a spacer film which extends along side surfaces of the filling film and separates the filling film from the substrate.

8. The image sensor of claim 1, wherein the substrate includes impurities of a first conductive type, and each of the first photoelectric conversion region and the second photoelectric conversion region includes impurities of a second conductive type different from the first conductive type.

9. The image sensor of claim 8, wherein the isolation region includes impurities of the first conductive type.

10. The image sensor of claim 1, wherein each of the first photoelectric conversion region and the second photoelectric conversion region is closer to the second side of the substrate than the first side of the substrate.

11. The image sensor of claim 1, further comprising:
a microlens disposed on the first side of the substrate;
an electronic element disposed on the second side of the substrate; and
a wiring structure which includes an inter-wiring insulating film which covers the electronic element, and a plurality of wirings formed in the inter-wiring insulating film.

12. An image sensor comprising:
a substrate comprising a first side and a second side opposite to each other;
a pixel isolation pattern formed inside the substrate which defines a plurality of unit pixels;
a first photoelectric conversion region and a second photoelectric conversion region arranged along a first direction, inside each of the unit pixels;
a region isolation pattern which protrudes from the pixel isolation pattern in a second direction intersecting the first direction, and defines an isolation region between the first photoelectric conversion region and the second photoelectric conversion region;
a plurality of microlenses disposed on the first side of the substrate in correspondence with the plurality of the unit pixels;
an electronic element disposed on the second side of the substrate; and
a wiring structure which includes an inter-wiring insulating film which covers the electronic element, and a plurality of wirings formed in the inter-wiring insulating film,
wherein a first width of the isolation region in the second direction on the first side is more than about 1.1 times a second width of the isolation region in the second direction on the second side,
wherein the region isolation pattern includes a first side surface which intersects the second direction, and the first side surface of the region isolation pattern forms a first internal angle, which is an acute angle, with the second side of the substrate, and
wherein the region isolation pattern further includes a second side surface which intersects the first direction, and the second side surface of the region isolation pattern forms a second internal angle, which is an acute angle greater than the first internal angle, with the second side of the substrate.

13. The image sensor of claim 12, wherein the second width of the isolation region in the second direction increases from the second side of the substrate toward the first side of the substrate.

14. The image sensor of claim 12, wherein the electronic element includes a transfer transistor electrically connected to the first photoelectric conversion region.

15. The image sensor of claim 14, wherein the transfer transistor includes a vertical transfer gate which is at least partially buried inside the substrate.

16. The image sensor of claim 12, wherein the first width is about 280 nm to about 320 nm, and the second width is about 230 nm to about 270 nm.

17. The image sensor of claim 12, wherein a distance between the first side of the substrate and the second side of the substrate is about 5,000 nm to about 6,000 nm.

18. An image sensor, comprising:
a substrate comprising a first side on which light is incident, and a second side opposite to the first side;
a unit pixel formed in the substrate;
a pixel isolation pattern which surrounds the unit pixel;
a first photoelectric conversion region and a second photoelectric conversion region arranged along a first direction inside the unit pixel;
a first region isolation pattern which protrudes from the pixel isolation pattern in a second direction intersecting the first direction and is interposed between the first photoelectric conversion region and the second photoelectric conversion region; and
a second region isolation pattern which is spaced apart from the first region isolation pattern in the second direction, protrudes from the pixel isolation pattern in the second direction intersecting the first direction, and is interposed between the first photoelectric conversion region and the second photoelectric conversion region,
wherein a first width at which the first region isolation pattern and the second region isolation pattern are separated on the first side is greater than a second width at which the first region isolation pattern and the second region isolation pattern are separated on the second side,
wherein each of the first and second region isolation patterns includes a first side surface which intersects the second direction, and the first side surface of each of the first and second region isolation patterns forms a first internal angle, which is an acute angle, with the second side of the substrate, and
wherein a side surface of the pixel isolation pattern forms a second internal angle, which is an acute angle greater than the first internal angle, with the second side of the substrate.

* * * * *